United States Patent
Masuoka et al.

(10) Patent No.: US 9,653,170 B2
(45) Date of Patent: May 16, 2017

(54) PILLAR-SHAPED SEMICONDUCTOR MEMORY DEVICE AND METHOD FOR PRODUCING THE SAME

(71) Applicant: Unisantis Electronics Singapore Pte. Ltd., Singapore (SG)

(72) Inventors: Fujio Masuoka, Tokyo (JP); Nozomu Harada, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/228,687

(22) Filed: Aug. 4, 2016

(65) Prior Publication Data

US 2016/0343442 A1 Nov. 24, 2016

Related U.S. Application Data

(63) Continuation of application No. PCT/JP2014/076859, filed on Oct. 7, 2014.

(51) Int. Cl.
*G11C 16/04* (2006.01)
*H01L 27/115* (2017.01)
(Continued)

(52) U.S. Cl.
CPC .......... *G11C 16/10* (2013.01); *G11C 16/0466* (2013.01); *G11C 16/14* (2013.01); *H01L 27/11556* (2013.01); *H01L 27/11582* (2013.01)

(58) Field of Classification Search
CPC . G11C 16/0466; G11C 16/0483; G11C 16/10; G11C 16/14; H01L 27/11565; H01L 27/1157; H01L 27/11582
See application file for complete search history.

(56) References Cited

U.S. PATENT DOCUMENTS

| | | |
|---|---|---|
| 2002/0195668 A1 | 12/2002 | Endoh et al. |
| 2010/0140685 A1 | 6/2010 | Kang et al. |

(Continued)

FOREIGN PATENT DOCUMENTS

| | | |
|---|---|---|
| JP | H02-188966 A | 7/1990 |
| JP | H04-79369 A | 3/1992 |

(Continued)

OTHER PUBLICATIONS

Masuoka, F. et al., "New Ultra High Density EPROM and Flash EPROM With NAND Structured Cell", *IEDM Tech. Dig.*, 1987, pp. 552-555.

(Continued)

*Primary Examiner* — Allison P Bernstein
(74) *Attorney, Agent, or Firm* — Brinks Gilson & Lione

(57) ABSTRACT

A pillar-shaped semiconductor memory device includes Si pillars arranged in at least two rows; a tunnel insulating layer; a data charge storage insulating layer; first, second, and third interlayer insulating layers; and first and second conductor layers, all of which surround outer peripheries of the Si pillars, the first and second conductor layers being located at the same height in a perpendicular direction. A row of the semiconductor pillars is interposed between the first and second conductor layers of Si pillars arranged in an X direction. Shapes of the first and second conductor layers facing the semiconductor pillars are circular arcs. Adjacent circular arcs of the first conductor layer are in contact with each other, and adjacent circular arcs of the second conductor layer are in contact with each other. A pitch length of the Si pillars in the X direction is smaller than that in a Y direction.

12 Claims, 20 Drawing Sheets

(51) Int. Cl.
*G11C 16/10* (2006.01)
*G11C 16/14* (2006.01)
*H01L 27/11556* (2017.01)
*H01L 27/11582* (2017.01)

(56) References Cited

U.S. PATENT DOCUMENTS

| | | |
|---|---|---|
| 2010/0237400 A1 | 9/2010 | Aoyama |
| 2010/0327340 A1 | 12/2010 | Oota et al. |
| 2013/0062681 A1 | 3/2013 | Fujiki et al. |
| 2014/0239376 A1* | 8/2014 | Zhang ................ H01L 29/7827 257/324 |

FOREIGN PATENT DOCUMENTS

| | | |
|---|---|---|
| JP | 2003-7868 A | 1/2003 |
| JP | 2010-219409 A | 9/2010 |
| JP | 2011-9409 A | 1/2011 |
| JP | 2011-165815 A | 8/2011 |
| JP | 2013-69841 A | 4/2013 |
| JP | 2014-187329 A | 10/2014 |

OTHER PUBLICATIONS

Stewart, A. et al., "Microtopography of Surface Eroded by Ion-Bombardment", *Journal of Material Science*, vol. 4, 1969, pp. 56-69.

Ting, C. et al., "Study of Planarized Sputter-Deposited SiO2", *J. Vac. Sci. Technol.*, vol. 15, No. 3, May/Jun. 1978, pp. 1105-1112.

International Search Report in corresponding International Application No. PCT/JP2014/076859, dated Jan. 6, 2015, 5 pages.

\* cited by examiner

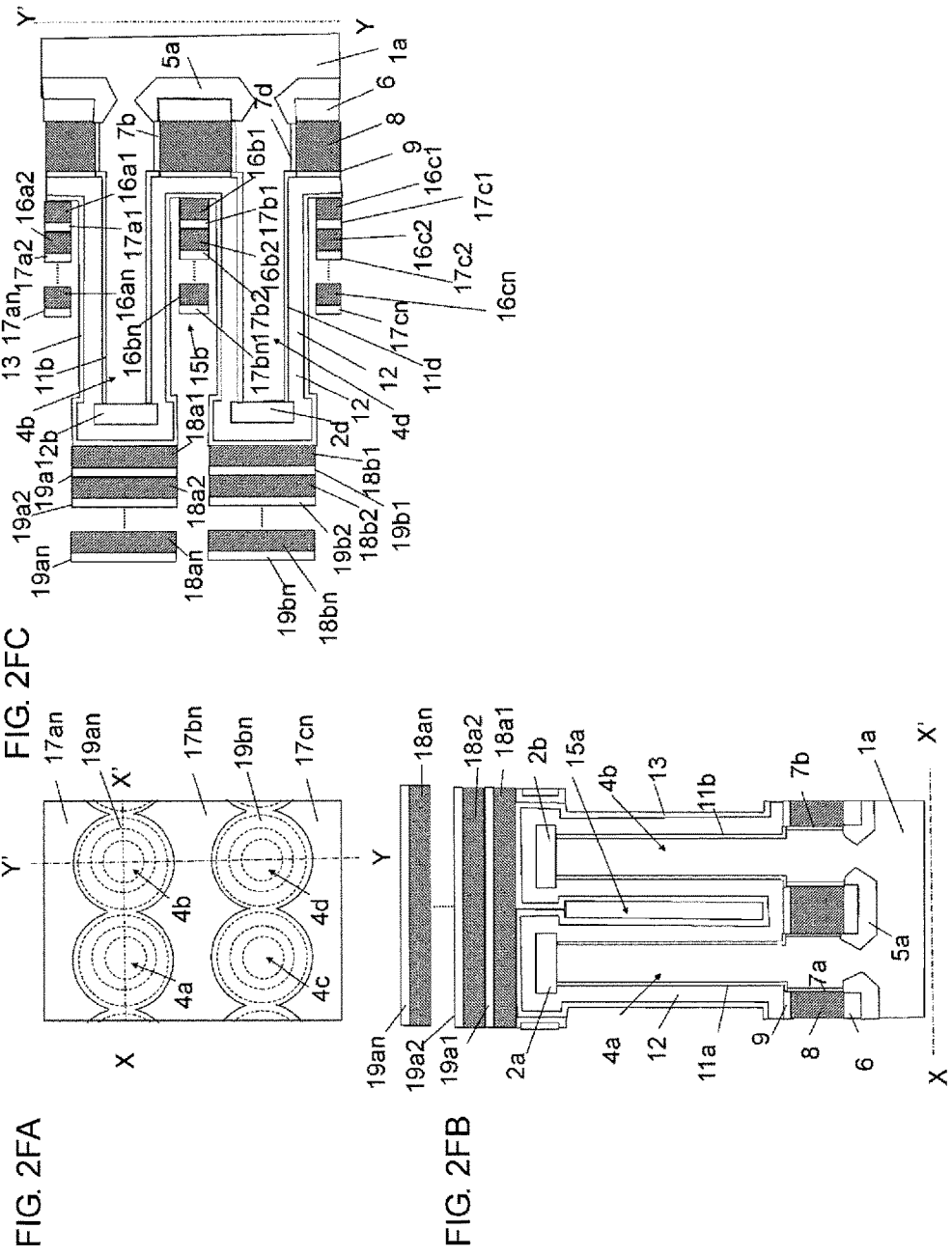

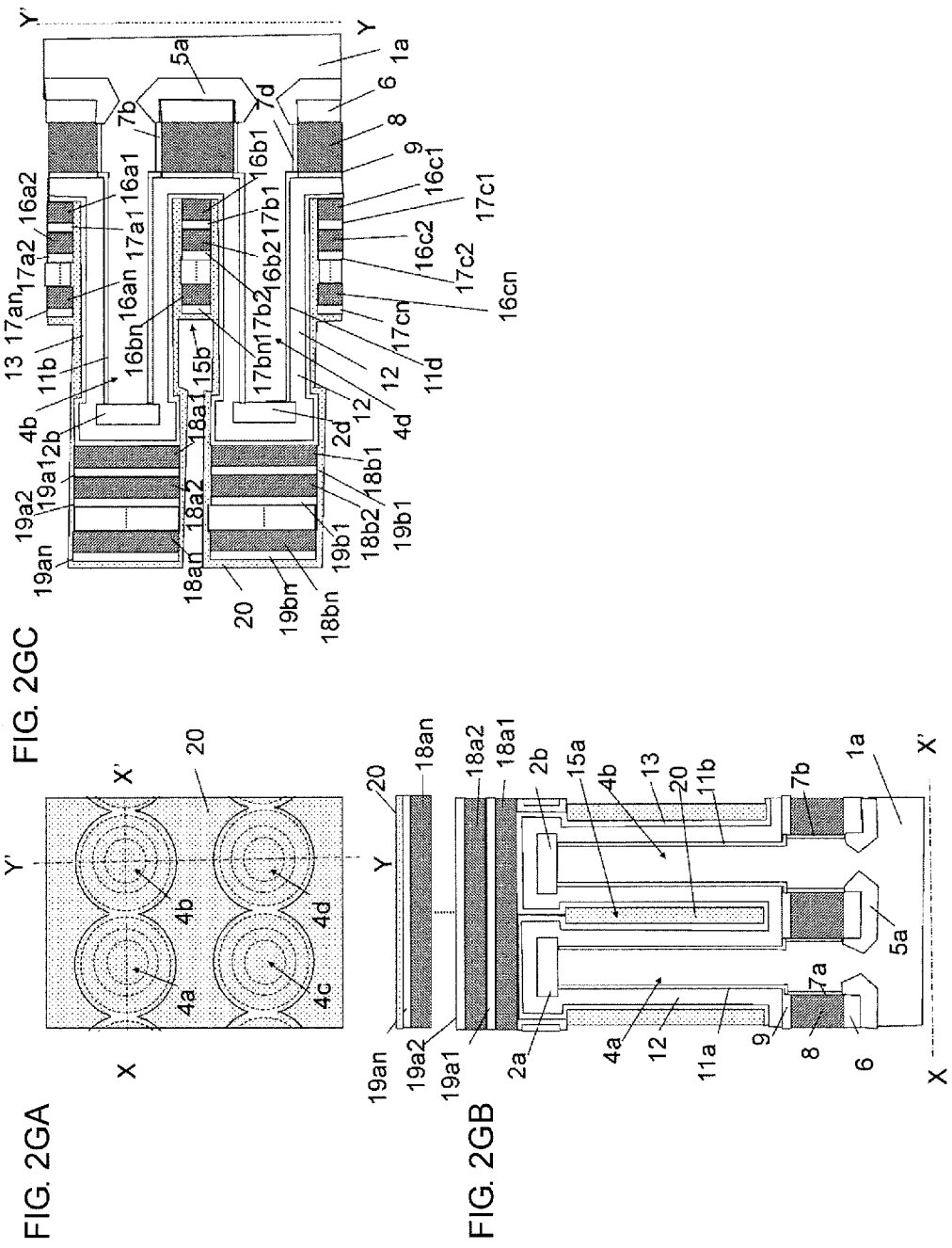

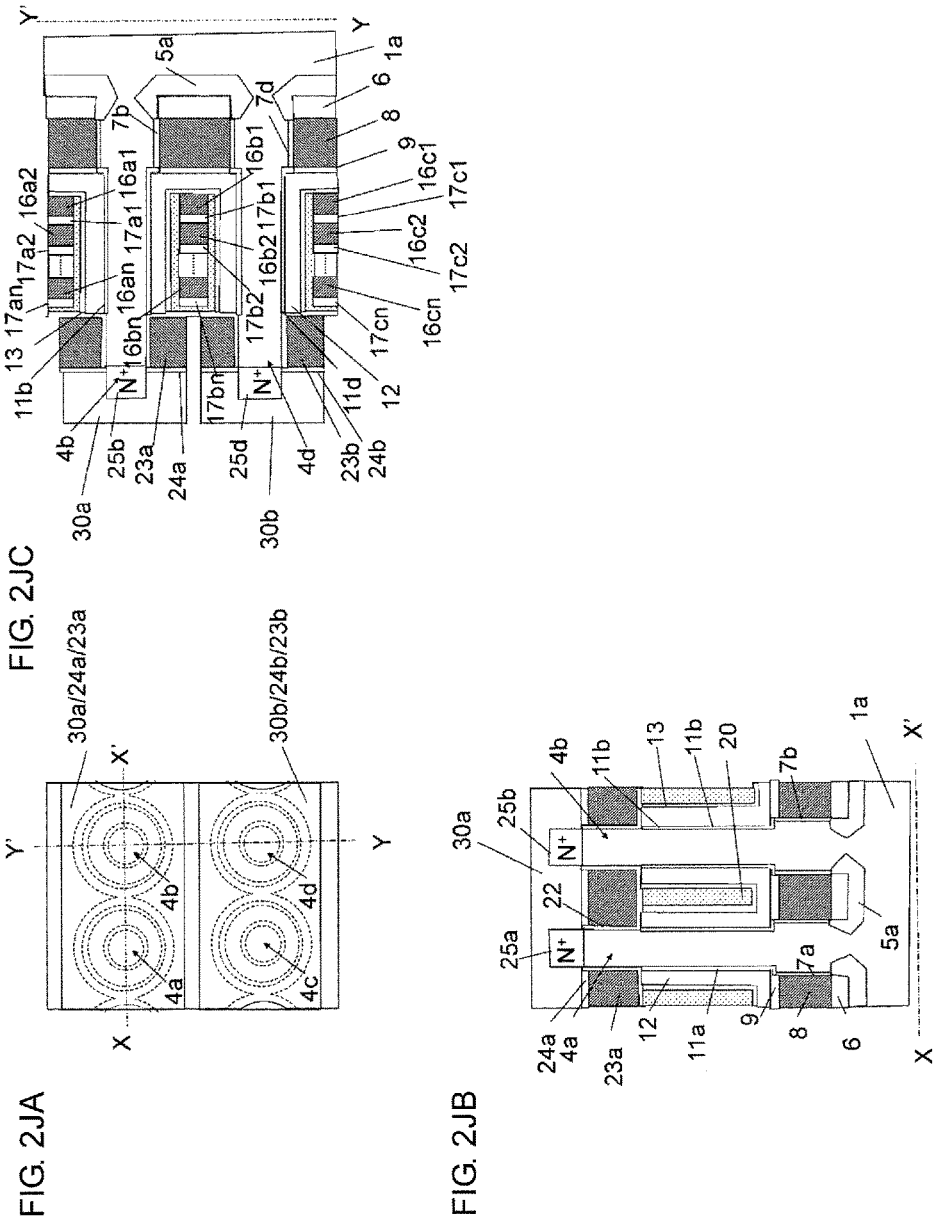

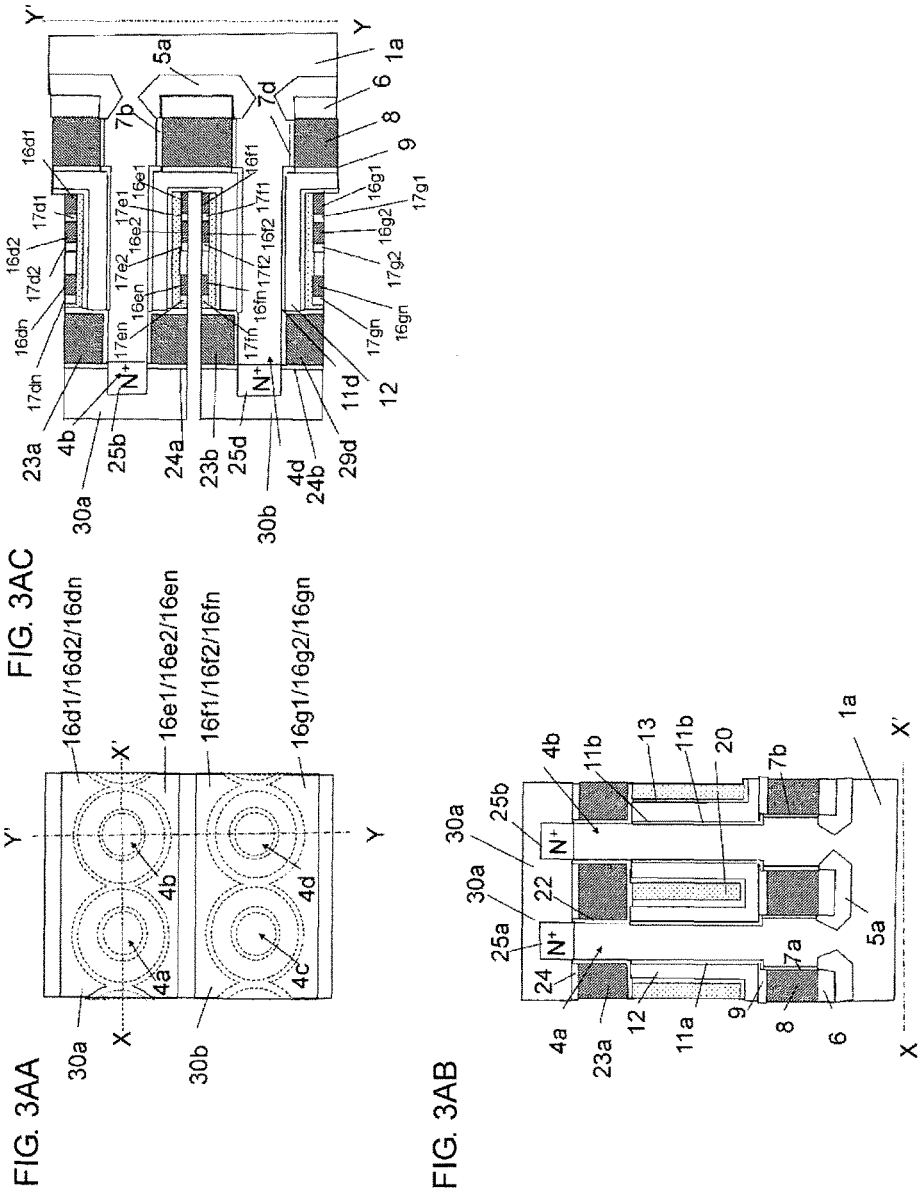

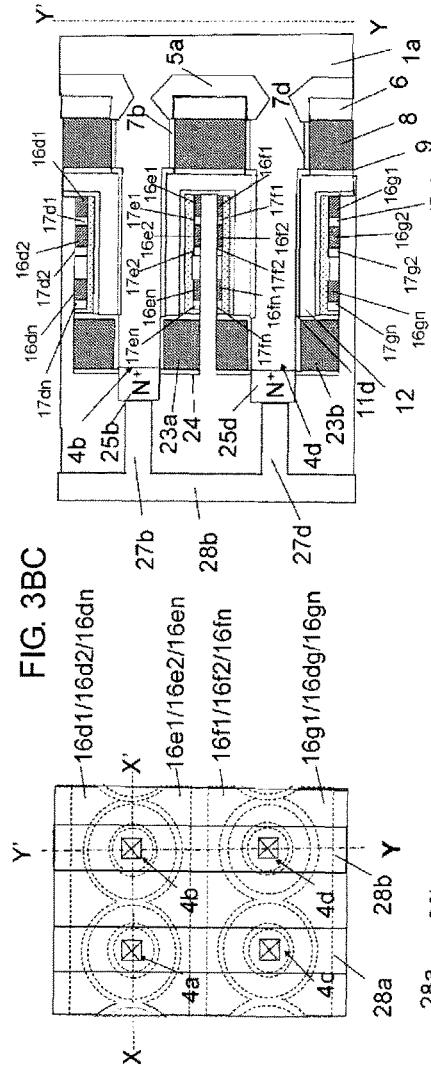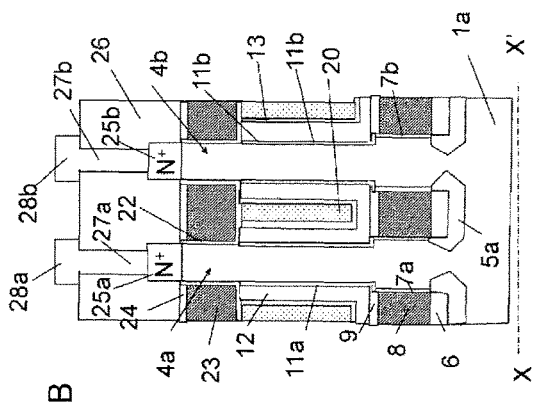
FIG. 3BC
FIG. 3BA
FIG. 3BB

PILLAR-SHAPED SEMICONDUCTOR MEMORY DEVICE AND METHOD FOR PRODUCING THE SAME

RELATED APPLICATIONS

The present application is a continuation of International Application PCT/JP2014/076859, with an international filing date of Oct. 7, 2014, the entire contents of which are incorporated herein by reference.

BACKGROUND OF THE INVENTION

1. Field of the Invention

The present invention relates to a pillar-shaped semiconductor memory device including memory elements formed around a pillar-shaped semiconductor, and a method for producing the device.

2. Description of the Related Art

In recent years, electronic devices using a memory device typified by flash memory have been used in various fields, and the application fields and the market size of the devices have been increasingly expanding. With these circumstances, the realization of highly integrated memory devices and a reduction in the cost of the memory devices have been desired.

NAND-type flash memory is advantageous in terms of the degree of integration and cost thereof (for example, F. Masuoka, M. Momotomi, Y. Iwata, and R. Shirota: "New ultra high density EPROM and Flash EEPROM with NAND structured cell", IEDM Tech. Dig. pp. 552-555 (1987)). Japanese Unexamined Patent Application Publication No. 4-79369 (Patent Literature 1) discloses, as highly integrated NAND-type flash memory, a vertical NAND flash memory device including a plurality of memory cell-transistors stacked on a semiconductor silicon pillar (hereinafter, a semiconductor silicon pillar is referred to as "Si pillar") in a direction in which the Si pillar stands.

The vertical NAND flash memory device disclosed in Patent Literature 1 will be described with reference to FIG. 6. FIG. 6 illustrates a sectional structure of the vertical NAND flash memory device disclosed in Patent Literature 1. Silicon (Si) pillars 101a and 101b are formed on an intrinsic semiconductor silicon substrate 100 (hereinafter, an intrinsic semiconductor silicon substrate is referred to as "i-layer substrate"). Silicon dioxide ($SiO_2$) layers 102a and 102b which are tunnel insulating layers are formed so as to surround outer peripheral portions of the Si pillars 101a and 101b, respectively. Floating electrodes 103a and 103b that electrically float are formed so as to surround outer peripheral portions of the $SiO_2$ layers 102a and 102b, respectively. Source-side selection gate electrodes 104a and 104b are formed around lower portions of the Si pillars 101a and 101b, respectively. Drain-side selection gate electrodes 105a and 105b are formed around upper portions of the Si pillars 101a and 101b, respectively. Interlayer $SiO_2$ layers 107a and 107b are formed so as to surround outer peripheries of the floating electrodes 103a and 103b, respectively. Word-line electrodes 108a and 108b are formed so as to surround outer peripheries of the interlayer $SiO_2$ layers 107a and 107b, respectively. A common source $N^+$ layer 109 (hereinafter, a semiconductor layer containing a donor impurity in a large amount is referred to as "$N^+$ layer") is formed in a surface layer of the i-layer substrate 100, the surface layer extending to bottom portions of the Si pillars 101a and 101b. Drain $N^+$ layers 110a and 110b are formed in top portions of the Si pillars 101a and 101b, respectively. A $SiO_2$ layer 111 is further formed by chemical vapor deposition (CVD) so as to cover the whole surface. Bit-line wiring metal layers 113a and 113b are respectively formed through contact holes 112a and 112b formed on the drain $N^+$ layers 110a and 110b, respectively. Furthermore, $P^-$ layers 114a and 114b (hereinafter, a semiconductor layer containing an acceptor impurity in a small amount is referred to as "$P^-$ layer") are respectively formed in the Si pillars 101a and 101b on the i-layer substrate 100. Memory cell-transistors Qc1 include the $SiO_2$ layers 102a and 102b, the floating electrodes 103a and 103b, the interlayer $SiO_2$ layers 107a and 107b, and the word-line electrodes 108a and 108b, all of which are formed so as to surround outer peripheral portions of the $P^-$ layers 114a and 114b in the Si pillars 101a and 101b, respectively. Memory cell-transistors Qc2 and Qc3 that have the same structures as the memory cell-transistors Qc1 are formed on the Si pillars 101a and 101b. The memory cell-transistors Qc1, Qc2, and Qc3 are electrically insulated from each other. The memory cell-transistors Qc1, Qc2, and Qc3 are stacked in a direction in which the Si pillars 101a and 101b stand. Furthermore, source-side selection transistors Qs1 having the source-side selection gate electrodes 104a and 104b are formed below the memory cell-transistors Qc1, Qc2, and Qc3. Drain-side selection transistors Qs2 having the drain-side selection gate electrodes 105a and 105b are formed above the memory cell-transistors Qc1, Qc2, and Qc3.

In producing the vertical NAND flash memory device disclosed in Patent Literature 1, the $SiO_2$ layers 102a and 102b which are tunnel insulating layers, the interlayer $SiO_2$ layers 107a and 107b, the source-side selection gate electrodes 104a and 104b, the drain-side selection gate electrodes 105a and 105b, the floating electrodes 103a and 103b, and the word-line electrodes 108a and 108b are formed so as to surround outer peripheral portions of the Si pillars 101a and 101b, respectively. In this case, it is difficult to form these layers and electrodes so as to have less defects and high reliability.

A possible higher-density vertical NAND flash memory device is a NAND-type flash memory device including two NAND-type flash memory elements formed on a single Si pillar.

An example of such a NAND-type flash memory device will be described with reference to FIGS. 7A and 7B. FIG. 7A is a schematic view of a three-dimensional structure of a NAND-type flash memory device, and FIG. 7B is a schematic view of a sectional structure of the NAND-type flash memory device. A tunnel insulating layer 122 is formed so as to surround a Si pillar 120. A plurality of first floating electrodes FGa1, FGa2, and FGan and a plurality of second floating electrodes FGb1, FGb2, and FGbn are formed on outer peripheral portions of the tunnel insulating layer 122 so as to be arranged in a direction in which the Si pillar 120 stands. The first floating electrodes FGa1, FGa2, and FGan and the corresponding second floating electrodes FGb1, FGb2, and FGbn are disposed at the same height in the direction in which the Si pillar 120 stands, and isolated from each other. An interlayer insulating layer 125 is formed so as to surround the first floating electrodes FGa1, FGa2, and FGan and the second floating electrodes FGb1, FGb2, and FGbn. First control electrodes CGa1, CGa2, and CGan are respectively formed on the first floating electrodes FGa1, FGa2, and FGan with the interlayer insulating layer 125 therebetween. Second control electrodes CGb1, CGb2, and CGbn are respectively formed on the second floating electrodes FGb1, FGb2, and FGbn with the interlayer insulating layer 125 therebetween. The first control electrodes CGa1, CGa2, and CGan and the corresponding second control electrodes CGb1, CGb2, and CGbn are disposed at the same height in the direction in which the Si pillar 120 stands, and isolated from each other. A gate insulating layer 123a is formed, so as to surround the Si pillar 120, in contact with the tunnel insulating layer 122 and below the tunnel insulating layer 122 in the direction in which the Si pillar 120 stands. A source-side selection electrode 124a is formed so as to surround the gate insulating layer 123a. A gate insulating layer 123b is formed, so as to surround the Si pillar 120, in contact with the tunnel insulating layer 122 and above the tunnel insulating layer 122 in the direction in which the Si pillar 120 stands. A drain-side selection electrode 124b is formed so as to surround the gate insulating layer 123b. A source $N^+$ layer 121a is formed in a bottom portion of the Si pillar 120. A drain $N^+$ layer 121b is formed in a top portion of the Si pillar 120. The first control electrodes CGa1, CGa2, and CGan are connected to first word-line wring layers WLa1, WLa2, and WLan, respectively. The second control electrodes CGb1, CGb2, and CGbn are connected to second word-line wring layers WLb1, WLb2, and WLbn, respectively. The first word-line wring layers WLa1, WLa2, and WLan and the second word-line wring layers WLb1, WLb2, and WLbn are driven electrically independently. The Si pillar 120 functioning as a channel, the gate insulating layer 123b, and the drain-side selection electrode 124b form a drain-side selection transistor. The Si pillar 120 functioning as a channel, the gate insulating layer 123a, and the source-side selection electrode 124a form a source-side selection transistor. The source-side selection electrode 124a is connected to a source-side selection gate line SGSa. The drain-side selection electrode 124b is connected to a drain-side selection gate line SGDa. The source $N^+$ layer 121a is connected to a common source line CSLa. The drain $N^+$ layer 121b is connected to a bit-line wiring BLa.

According to the vertical NAND flash memory device illustrated in FIGS. 7A and 7B, a first NAND-type flash memory element and a second NAND-type flash memory element are formed on the single Si pillar 120. The first NAND-type flash memory element and the second NAND-type flash memory element share the source $N^+$ layer 121a, the drain $N^+$ layer 121b, the source-side selection transistor, and the drain-side selection transistor. The first NAND-type flash memory element includes, as a channel, a surface layer portion of the Si pillar 120 facing the first control electrodes CGa1, CGa2, and CGan. The second NAND-type flash memory element includes, as a channel, a surface layer portion of the Si pillar 120 facing the second control electrodes CGb1, CGb2, and CGbn.

In producing the vertical NAND flash memory device illustrated in FIGS. 7A and 7B, the tunnel insulating layer ($SiO_2$ layer) 122, the interlayer insulating layer (interlayer $SiO_2$ layer) 125, the source-side selection electrode 124a, the drain-side selection electrode 124b, the first floating electrodes FGa1, FGa2, and FGan, the second floating electrodes FGb1, FGb2, and FGbn, the first control electrodes CGa1, CGa2, and CGan, and the second control electrodes CGb1, CGb2, and CGbn are formed so as to surround outer peripheral portions of the Si pillar 120. Also in this case, it is difficult to form these layers and electrodes so as to have less defects and high reliability. Furthermore, in this vertical NAND flash memory device, a reliable operation is desired for the two NAND-type flash memory elements connected in parallel.

Japanese Unexamined Patent Application Publication No. 2011-165815 (Patent Literature 2) discloses a method for producing a semiconductor memory device, the method including repeatedly stacking a word-line electrode material layer and an insulating layer on a substrate, forming a through-hole passing through the resulting stacked word-line conductor layers and the interlayer insulating layers, forming an interlayer insulator layer, a data charge storage layer that stores data charges, and a tunnel insulating layer on a surface layer of the side surface of the through-hole, further filling the through-hole with a poly-Si layer (hereinafter, a polycrystalline Si layer is referred to as "poly-Si layer") functioning as a channel, and forming two NAND-type flash memory elements including the poly-Si layer as channels.

The method for producing a semiconductor memory device disclosed in Patent Literature 2 will be described with reference to FIG. 8. FIG. 8 is a plan view of a semiconductor memory device including word-line conductor layers disposed on two sides of an outer peripheral portion of a semiconductor pillar, and two NAND-type flash memory elements that are formed on two semiconductor pillars in a connecting manner. First, material layers each including, as one set, a conductor layer functioning as a word line, and an insulating layer formed on the conductor layer are stacked in a vertical direction in plan view to form a stacked material layer (not illustrated). Next, a circular hole Tc having a circular shape in plan view and a rectangular hole Ts connected to the circular hole Tc, the circular hole Tc and the rectangular hole Ts penetrating through the stacked material layer, are formed (the whole of the circular hole Tc and the rectangular hole Ts are referred to as "through-hole T"). Next, an interlayer insulating layer 130 formed of, for example, a $SiO_2$ layer is formed in the through-hole T. The interlayer insulating layer 130 includes an interlayer insulating layer 130a in the circular hole Tc and an interlayer insulating layer 130b in the rectangular hole Ts. The side surface of the circular hole Tc is covered with the interlayer insulating layer 130a. The whole of the rectangular hole Ts is filled with the interlayer insulating layer 130b. Next, a data charge storage layer 131 formed of, for example, a $Si_3N_4$ layer (silicon nitride layer) is formed on the inner side surface of the interlayer insulating layer 130a in the circular hole Tc. Next, a tunnel insulating layer 132 formed of, for example, a $SiO_2$ layer is formed on the inner side surface of the data charge storage layer 131. Next, the through-hole surrounded by the tunnel insulating layer 132 is filled with, for example, poly-Si to form semiconductor pillars Pa and Pb. Next, the stacked material layer in a region 135 disposed between the semiconductor pillars Pa and Pb is removed by etching. As a result, a conductor layer CGa and a conductor layer CGb that function as word lines and that are isolated on two sides of the semiconductor pillars Pa and Pb in the Y direction are formed. Next, a common source diffusion layer and a source-side selection transistor are formed in a top portion of each of the semiconductor pillars Pa. A drain diffusion layer and a drain-side selection transistor are formed in a top portion of each of the semiconductor pillar Pb. A connecting portion that connects the channel of the semiconductor pillar Pa and the channel of the semiconductor pillar Pb is formed in a bottom portion of the semiconductor pillars Pa and Pb. This structure provides a semiconductor memory device including two NAND-type flash memory elements which have independent channels on surface layers of the semiconductor pillars Pa and Pb on the left and the right in the Y direction, in which when one of the elements is controlled by the word-line conductor layer CGa, the other is controlled by the word-line conductor layer CGb, and which are connected to the semiconductor pillars Pa and Pb.

In the formation of the through-hole T in the semiconductor memory device illustrated in FIG. 8, a width La of the rectangular hole Ts in the Y direction needs to be smaller than a diameter Lb of the circular hole Tc. The reason for this is to make the outer perimeter of the circular hole Tc disposed between the rectangular holes Is long as much as possible so as to increase the area of the channels of the semiconductor pillars Pa and Pb controlled by the word-line conductor layers CGa and CGb. With this structure, since a read-out current of the NAND-type flash memory elements can be increased, memory cell data can be easily read. The circular holes Tc and the rectangular holes Ts are formed at the same time using lithography and reactive ion etching (RIE). In this case, the width La in the Y direction is the minimum process dimension, and thus the diameter Lb of each of the circular holes Tc is larger than the width La. Therefore, it is necessary to form the circular holes Tc having a large diameter Lb in the Y direction, and thus the degree of integration of the flash memory elements may be decreased. Furthermore, in order to form the circular holes Tc by patterning with lithography so as to be adjacent to each other and to have a circular shape, it is necessary to form a gap between the circular holes Tc. Therefore, in the X direction, the rectangular holes Ts need to be formed between the circular holes Tc, and thus the degree of integration of the flash memory elements may be decreased. As described above, in both the X direction and the Y direction, there may be a problem in that the degree of integration of the flash memory elements is decreased by the presence of the rectangular holes Ts.

In addition, it is difficult to form the interlayer insulating layer 130a, the data charge storage layer 131, and the tunnel insulating layer 132 having less defects and high reliability on the surface layer of the side surface of the deep through-hole T. Furthermore, the channels of, for example, poly-Si semiconductor pillars Pa and Pb have a lower mobility and a larger trap level, which may cause an increase in the threshold voltage, compared with channels formed of single-crystal Si. Accordingly, a high read-out current is necessary, resulting in a difficulty in a low-voltage driving.

SUMMARY OF THE INVENTION

In view of the above problems, it is desirable to provide a highly reliable, high-density pillar-shaped semiconductor memory device at a low cost.

A pillar-shaped semiconductor memory device according to a first aspect of the present invention includes a semiconductor substrate; semiconductor pillars disposed on the semiconductor substrate, extending in a direction perpendicular to a surface of the semiconductor substrate, and arranged in at least two rows; a tunnel insulating layer surrounding an outer periphery of each of the semiconductor pillars; a data charge storage insulating layer surrounding an outer periphery of the tunnel insulating layer; a first interlayer insulating layer surrounding an outer periphery of the data charge storage insulating layer; and a first stacked material layer and a second stacked material layer that are disposed on the semiconductor substrate so that one row of the semiconductor pillars is interposed between the first stacked material layer and a second stacked material layer. The first stacked material layer is at least one laminate including, as one set, a first conductor layer surrounding a part of an outer periphery of the first interlayer insulating layer of the semiconductor pillars arranged in the one row, and a second interlayer insulating layer formed on or under the first conductor layer. The second stacked material layer is at least one laminate including, as one set, a second conductor layer surrounding another part of the outer periphery of the first interlayer insulating layer of the semiconductor pillars arranged in the one row, and disposed at the same position as that of the first conductor layer in the direction perpendicular to the surface of the semiconductor substrate, and a third interlayer insulating layer formed on or under the second conductor layer. A pitch length between semiconductor pillars adjacent to each other in the one row of the semiconductor pillars is smaller than a pitch length between a semiconductor pillar in the one row and a semiconductor pillar in a row other than the one row. In plan view, shapes of the first conductor layer and the second conductor layer, the shapes facing the semiconductor pillars, are circular arc shapes, and, between the semiconductor pillars adjacent to each other, the circular arcs of the first conductor layer are in contact with each other and the circular arcs of the second conductor layer are in contact with each other. In plan view, the first interlayer insulating layer is disposed between a contact point of the circular arcs of the first conductor layer and a contact point of the circular arcs of the second conductor layer. Data writing and erasing due to a data charge transfer between the semiconductor pillars and the data charge storage insulating layer through the tunnel insulating layer or a data charge retention by the data charge storage insulating layer is performed by application of a voltage to the first conductor layer and the second conductor layer.

The pillar-shaped semiconductor memory device preferably further includes a fourth interlayer insulating layer between the data charge storage insulating layer and the first interlayer insulating layer.

The first interlayer insulating layer is preferably connected to upper surfaces of the first stacked material layer and the second stacked material layer.

In addition to the one row, the other row of the semiconductor pillars, the other row being adjacent to the one row, is preferably interposed between the first stacked material layer and the second stacked material layer in plan view, the second conductor layer disposed adjacent to the one row and the first conductor layer disposed adjacent to the other row preferably face each other, and the second conductor layer disposed adjacent to the one row is preferably connected to the first conductor layer disposed adjacent to the other row.

In addition to the one row, the other row of the semiconductor pillars, the other row being adjacent to the one row, is preferably interposed between the first stacked material layer and the second stacked material layer in plan view, the second conductor layer disposed adjacent to the one row and the first conductor layer disposed adjacent to the other row preferably face each other, and the second conductor layer disposed adjacent to the one row is preferably separated from the first conductor layer disposed adjacent to the other row.

A section of each of the semiconductor pillars in plan view preferably has an elliptical shape, in plan view, a minor axis of the elliptical shape preferably extends in a direction in which the semiconductor pillars are arranged in the one row, and a major axis of the elliptical shape preferably extends in a direction perpendicular to the direction in which the semiconductor pillars are arranged in the one row.

The pillar-shaped semiconductor memory device preferably further includes a first impurity layer disposed in a lower portion of each of the semiconductor pillars and containing a donor or acceptor impurity; a first gate insulating layer that surrounds the semiconductor pillar above the first impurity layer and that is in contact with the tunnel insulating layer; a first gate conductor layer that surrounds the first gate insulating layer and that is adjacent to the first conductor layer and the second conductor layer; a second impurity layer disposed in an upper portion of the semiconductor pillar and having the same conductivity type as the first impurity layer, a second gate insulating layer that surrounds the semiconductor pillar below the second impurity layer and that is in contact with the tunnel insulating layer; and a second gate conductor layer that surrounds the second gate insulating layer and that is adjacent to the first conductor layer and the second conductor layer.

A method for producing a pillar-shaped semiconductor memory device according to a second aspect of the present invention includes a circular insulating layer-forming step of forming a circular insulating layer on a semiconductor substrate; a semiconductor pillar-forming step of etching the semiconductor substrate using the circular insulating layer as a mask to form semiconductor pillars on the semiconductor substrate in at least two rows such that an arrangement pitch length between semiconductor pillars adjacent to each other in a row of the semiconductor pillars is smaller than an arrangement pitch length between semiconductor pillars arranged in adjacent two rows; a semiconductor pillar outer periphery retraction-forming step of, in plan view, retracting an outer periphery of each of the semiconductor pillars from an outer periphery of the circular insulating layer toward the inside; a tunnel insulating layer-forming step of forming a tunnel insulating layer that surrounds an outer periphery of each of the semiconductor pillars; a data charge storage insulating layer-forming step of forming a data charge storage insulating layer that covers the tunnel insulating layer and the circular insulating layer; a first conductor layer/second conductor layer-forming step of, using the data charge storage insulating layer on the circular insulating layer as a mask, allowing conductor material atoms to be incident in a direction perpendicular to a surface of the semiconductor substrate to form a first conductor layer and a second conductor layer above the semiconductor substrate and on the data charge storage insulating layer on the circular insulating layer in plan view; a first interlayer insulating layer/second interlayer insulating layer-forming step of, using the data charge storage insulating layer on the circular insulating layer as a mask, allowing insulating material atoms to be incident in the direction perpendicular to the surface of the semiconductor substrate to form a first interlayer insulating layer on or under the first conductor layer and a second interlayer insulating layer on or under the second conductor layer; and a third interlayer insulating layer-forming step of forming a third interlayer insulating layer between an outer peripheral side surface of the data charge storage insulating layer surrounding each of the semiconductor pillars and side surfaces of the first conductor layer and the first interlayer insulating layer and between the outer peripheral side surface of the data charge storage insulating layer surrounding each of the semiconductor pillars and side surfaces of the second conductor layer and the second interlayer insulating layer. In the data charge storage insulating layer-forming step, in plan view, an outer edge of the data charge storage insulating layer on the side surfaces of the circular insulating layers on semiconductor pillars adjacent to each other in one row of the semiconductor pillars is formed to have circular arc shapes that are connected in contact with each other. In the first conductor layer/second conductor layer-forming step, the first conductor layer and the second conductor layer are formed to extend such that the one row of the semiconductor pillars is interposed between the first conductor layer and the second conductor layer in plan view.

The method preferably further includes, before the third interlayer insulating layer-forming step, a fourth interlayer insulating layer-forming step of forming a fourth interlayer insulating layer so as to surround the data charge storage insulating layer. In plan view, the outer edge of the data charge storage insulating layer or the fourth interlayer insulating layer is preferably formed to have circular arc shapes that are connected in contact with each other between the side surfaces of the circular insulating layers on semiconductor pillars that are adjacent to each other in the one row of the semiconductor pillars.

The third interlayer insulating layer is preferably formed so as to be connected to upper surfaces of stacked material layers including the first conductor layer, the second conductor layer, the first interlayer insulating layer, and the second interlayer insulating layer.

In the first conductor layer/second conductor layer-forming step, the first conductor layer and the second conductor layer are preferably formed to extend such that, in addition to the one row, a row other than the one row of the semiconductor pillars, the other row being adjacent to the one row, is interposed between the first conductor layer and the second conductor layer in plan view, the second conductor layer disposed adjacent to the one row and the first conductor layer disposed adjacent to the other row preferably face each other, and the second conductor layer disposed adjacent to the one row is preferably connected to the first conductor layer disposed adjacent to the other row.

In the first conductor layer/second conductor layer-forming step, the first conductor layer and the second conductor layer are preferably formed to extend such that, in addition to the one row, a row other than the one row of the semiconductor pillars, the other row being adjacent to the one row, is interposed between the first conductor layer and the second conductor layer in plan view, the second conductor layer disposed adjacent to the one row and the first conductor layer disposed adjacent to the other row preferably face each other, and the second conductor layer disposed adjacent to the one row is preferably separated from the first conductor layer disposed adjacent to the other row.

In the semiconductor pillar-forming step, the semiconductor pillars are preferably formed so that a section of each of the semiconductor pillars in plan view has an elliptical shape, in plan view, a minor axis of the elliptical shape preferably extends in a direction in which the semiconductor pillars are arranged in the one row, and a major axis of the elliptical shape preferably extends in a direction perpendicular to the direction in which the semiconductor pillars are arranged in the one row.

According to the aspects of the present invention, a highly reliable, high-density pillar-shaped semiconductor memory device can be provided at a low cost.

BRIEF DESCRIPTION OF THE DRAWINGS

FIG. 2FA and FIGS. 2FB and 2FC are respectively a plan view and sectional structural views illustrating a method for producing a vertical NAND flash memory device according to the first embodiment.

FIG. 2GA and FIGS. 2GB and 2GC are respectively a plan view and sectional structural views illustrating a method for producing a vertical NAND flash memory device according to the first embodiment.

FIG. 2IA and FIGS. 2IB and 2IC are respectively a plan view and sectional structural views illustrating a method for producing a vertical NAND flash memory device according to the first embodiment.

FIG. 2JA and FIGS. 2JB and 2JC are respectively a plan view and sectional structural views illustrating a method for producing a vertical NAND flash memory device according to the first embodiment.

FIG. 3AA and FIGS. 3AB and 3AC are respectively a plan view and sectional structural views illustrating a method for producing a vertical NAND flash memory device according to a second embodiment of the present invention.

FIG. 3BA and FIGS. 3BB and 3BC are respectively a plan view and sectional structural views illustrating a method for producing a vertical NAND flash memory device according to the second embodiment of the present invention.

DETAILED DESCRIPTION OF THE PREFERRED EMBODIMENTS

Vertical NAND flash memory devices which are pillar-shaped semiconductor memory devices according to embodiments of the present invention, and methods for producing the devices will now be described with reference to the drawings.

First Embodiment

A method for producing a vertical NAND flash memory device according to a first embodiment of the present invention will be described with reference to FIG. 1 and FIGS. 2AA to 2KC.

Figure 1:
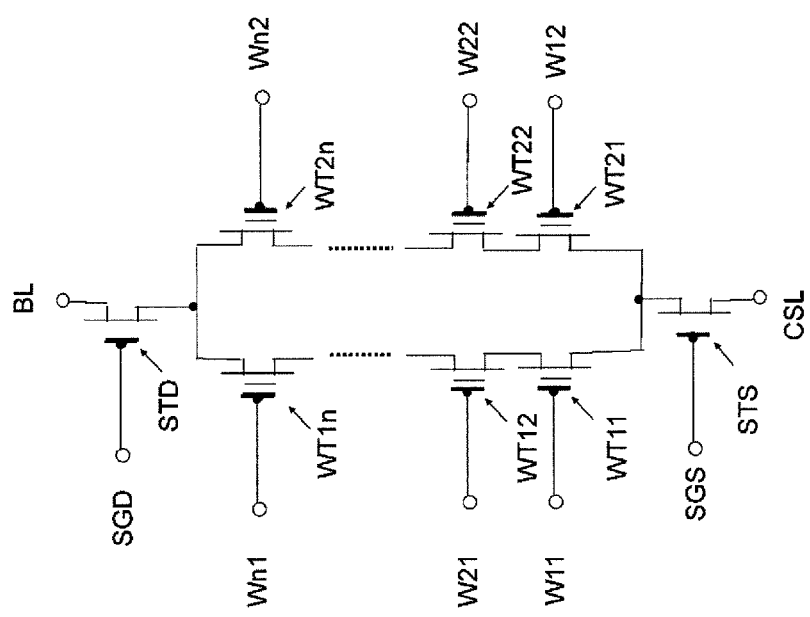
FIG. 1 is a circuit diagram of a vertical NAND flash memory device according to a first embodiment of the present invention.

FIG. 1 illustrates a circuit diagram of a NAND-type flash memory device formed on a single Si pillar according to the first embodiment. Gates of memory cell-transistors WT11, WT12, and WT1n, the number of which is n, and which are connected in series are respectively connected to word lines W11, W21, and Wn1, the number of which is n. Memory cell-transistors WT21, WT22, and WT2n, the number of which is n, and which are connected in series are formed in parallel with the memory cell-transistors WT11, WT12, and WT which are connected in series. Gates of the memory cell-transistors WT21, WT22, and WT2n are respectively connected to the word lines W12, W22, and Wn2, the number of which is n. Drains of the memory cell-transistors WT1n and the WT2n are connected to a drain-side selection transistor STD. Sources of the memory cell-transistors WT11 and the WT21 are connected to a source-side selection transistor STS. A gate of the source-side selection transistor STS is connected to a source-side selection gate line SGS. A gate of the drain-side selection transistor STD is connected to a drain-side selection gate line SGD. A source of the source-side selection transistor STS is connected to a common source line CSL. A drain of the drain-side selection transistor STD is connected to a bit line BL. The configuration including such a circuit is repeatedly formed in a block memory element region.

A method for producing a pillar-shaped semiconductor memory device according to the first embodiment will now be described with reference to FIGS. 2AA to 2KC. In FIGS. 2AA to 2KC, the drawings whose last reference character is A are plan views, the drawings whose last reference character is B are sectional views taken along line X-X' in the drawings whose last reference character is A, and the drawings whose last reference character is C are sectional views taken along line Y-Y' in the drawings whose last reference character is A.

Figure 2A:
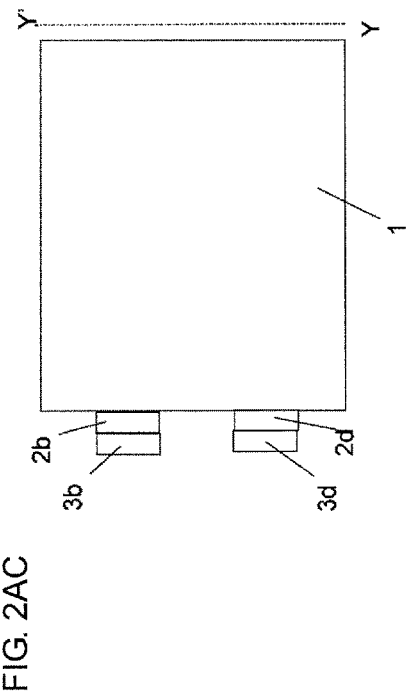
FIG. 2AA and FIGS. 2AB and 2AC are respectively a plan view and sectional structural views illustrating a method for producing a vertical NAND flash memory device according to the first embodiment.
Figure 2A:
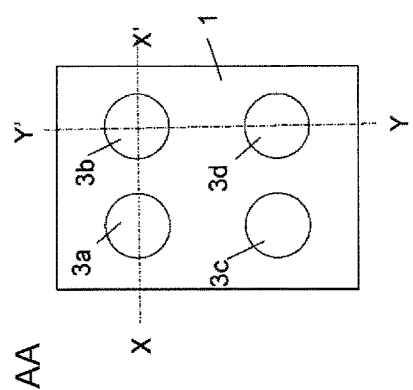
Figure 2A:
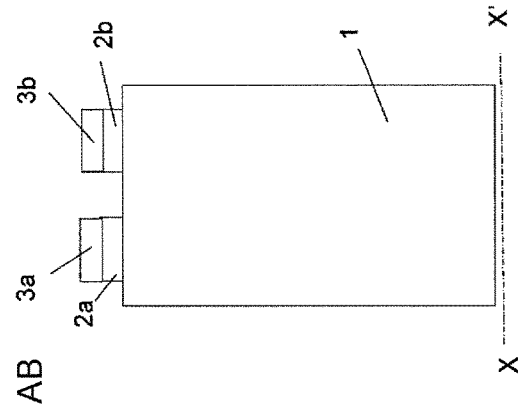

As illustrated in FIGS. 2AA to 2AC, a $Si_3N_4$ film (not illustrated) is formed on an i-layer substrate 1, a resist film (not illustrated) is applied onto the $Si_3N_4$ film, and resist layers 3a, 3b, 3c, and 3d each having a circular shape in plan view are formed by lithography. The resist layers 3a, 3b, 3c, and 3d are arranged in two rows and two columns. Next, the $Si_3N_4$ film is etched by, for example, reactive ion etching (RIE) using the resist layers 3a, 3b, 3c, and 3d as a mask to form $Si_3N_4$ layers 2a, 2b, 2c, and 2d, respectively.

Figure 2B:
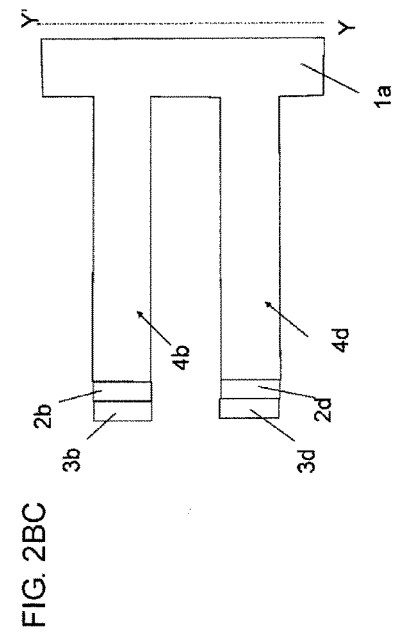
FIG. 2BA and FIGS. 2BB and 2BC are respectively a plan view and sectional structural views illustrating a method for producing a vertical NAND flash memory device according to the first embodiment.
Figure 2B:
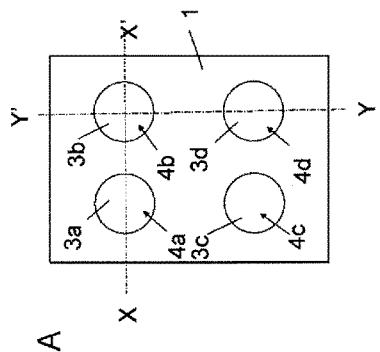
Figure 2B:
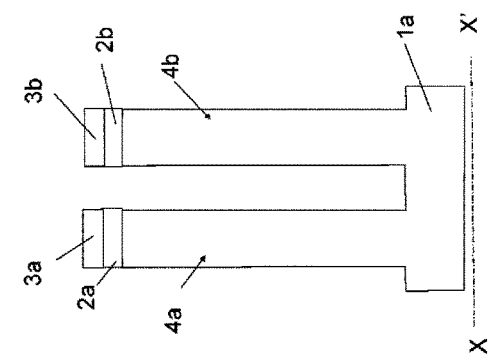

Next, as illustrated in FIGS. 2BA to 2BC, the i-layer substrate 1 is etched by, for example, RIE using the resist layers 3a, 3b, 3c, and 3d and the $Si_3N_4$ layers 2a, 2b, 2c, and 2d as a mask to respectively form Si pillars 4a, 4b, 4c, and 4d on an i-layer substrate 1a. The resist layers 3a, 3b, 3c, and 3d are then removed.

Figure 2C:
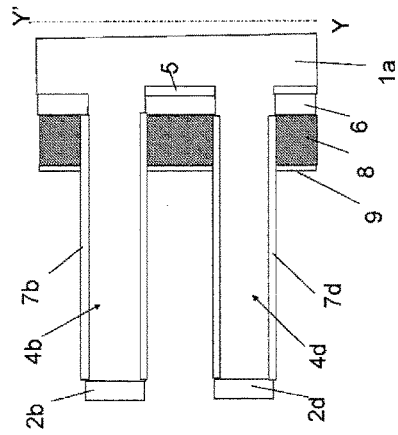
FIG. 2CA and FIGS. 2CB and 2CC are respectively a plan view and sectional structural views illustrating a method for producing a vertical NAND flash memory device according to the first embodiment.
Figure 2C:
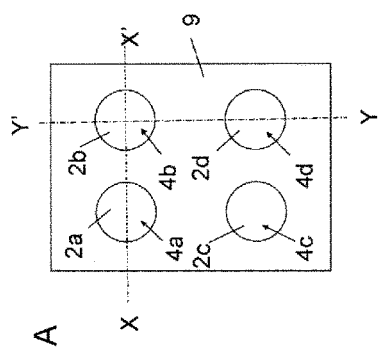
Figure 2C:
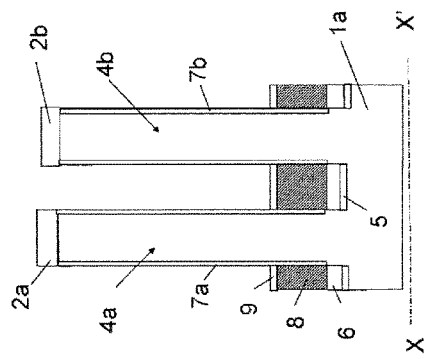

Next, as illustrated in FIGS. 2CA to 2CC, for example, an arsenic (As) ion is implanted into a surface layer of the i-layer substrate 1a disposed on lower outer peripheries of the Si pillars 4a, 4b, 4c, and 4d to form an $N^+$ layer 5. A $SiO_2$ layer 6 is formed on the i-layer substrate 1a disposed on the lower outer peripheries of the Si pillars 4a, 4b, 4c, and 4d. Furthermore, $SiO_2$ layers 7a, 7b, 7c, and 7d (the $SiO_2$ layer 7c is not illustrated in the figures) are respectively formed by, for example, a thermal oxidation method in surface layers of side surfaces of the Si pillars 4a, 4b, 4c, and 4d. Subsequently, a doped Si layer 8 (hereinafter, a poly-Si layer containing an acceptor or donor impurity is referred to as "doped Si layer") is formed on the $SiO_2$ layer 6 disposed on the lower outer peripheries of the Si pillars 4a, 4b, 4c, and 4d. Subsequently, a $Si_3N_4$ layer 9 is formed on the doped Si layer 8.

Figure 2D:
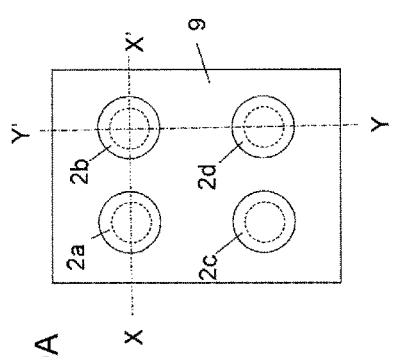
FIG. 2DA and FIGS. 2DB and 2DC are respectively a plan view and sectional structural views illustrating a method for producing a vertical NAND flash memory device according to the first embodiment.
Figure 2D:
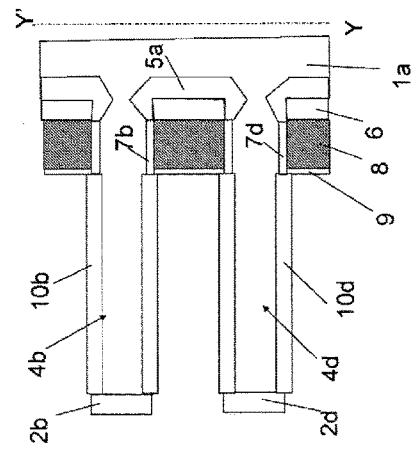
Figure 2D:
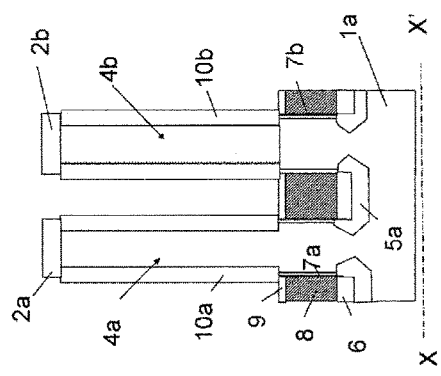

Next, as illustrated in FIGS. 2DA to 2DC, $SiO_2$ layers 10a, 10b, 10c, and 10d (the $SiO_2$ layer 10c is not illustrated in the figures) are formed by a thermal oxidation method so as to have a large thickness in surface layers of the side surfaces of the Si pillars 4a, 4b, 4c, and 4d, respectively, using the $Si_3N_4$ layers 2a, 2b, 2c, and 2d and the $Si_3N_4$ layer 9 as a mask. Subsequently, the $SiO_2$ layers 10a, 10b, 10c, and 10d are removed. The $Si_3N_4$ layers 2a, 2b, 2c, and 2d and the $Si_3N_4$ layer 9 are not oxidized by the thermal oxidation method. Therefore, as a result of the removal of the $SiO_2$ layers 10a, 10b, 10c, and 10d, the side surfaces of the Si pillars 4a, 4b, 4c, and 4d are retracted inward in the radial direction. Consequently, the diameters of cross sections of the Si pillars 4a, 4b, 4c, and 4d become smaller than the diameters of cross sections of the $Si_3N_4$ layers 2a, 2b, 2c, and 2d, respectively. Furthermore, the $N^+$ layer 5 is diffused by thermal diffusion during the thermal oxidation and becomes an $N^+$ layer 5a.

Figure 2E:
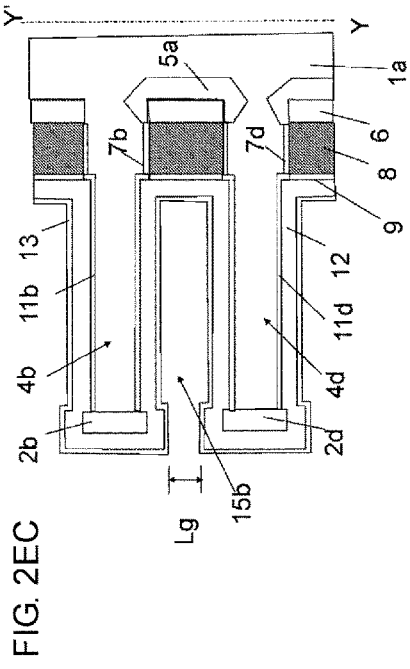
FIG. 2EA and FIGS. 2EB and 2EC are respectively a plan view and sectional structural views illustrating a method for producing a vertical NAND flash memory device according to the first embodiment.
Figure 2E:
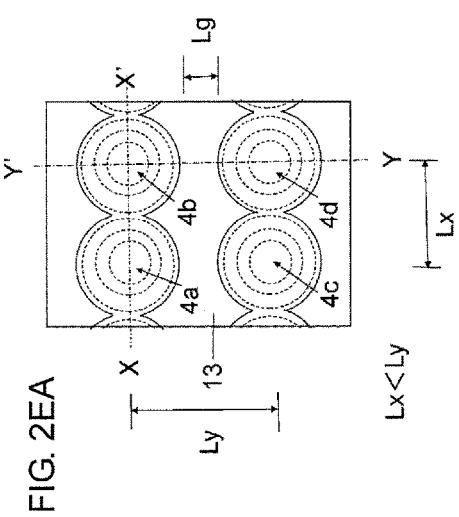
Figure 2E:
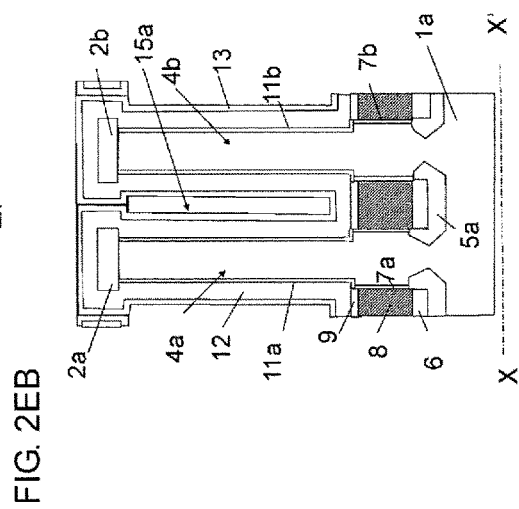

Next, as illustrated in FIGS. 2EA to 2EC, $SiO_2$ layers 11a, 11b, 11c, and 11d (the $SiO_2$ layer 11c is not illustrated in the figures) which are to become tunnel insulating layers are respectively formed by, for example, a thermal oxidation method in surface layers of the side surfaces of the Si pillars 4a, 4b, 4c, and 4d. Subsequently, a $Si_3N_4$ layer 12 which is to become a data charge storage insulating layer and a $SiO_2$ layer 13 which is to become an interlayer insulating layer are formed by, for example, atomic layer deposition (ALD) so as to cover the whole surface. As illustrated in FIG. 2EB, along line X-X', parts of the $SiO_2$ layer 13, the parts surrounding the side surfaces of the $Si_3N_4$ layers 2a and 2b, are formed so as to be in contact with each other between the Si pillars 4a and 4b. Similarly, parts of the $SiO_2$ layer 13, the parts surrounding the side surfaces of the $Si_3N_4$ layers 2c and 2d, are formed so as to be in contact with each other between the Si pillars 4c and 4d. As illustrated in FIG. 2EC, along line Y-Y', the part of the $SiO_2$ layer 13, the part surrounding the side surfaces of the $Si_3N_4$ layers 2a and 2b, and the part of the $SiO_2$ layer 13, the part surrounding the side surfaces of the $Si_3N_4$ layers 2c and 2d, are formed separately from each other. In this case, the device is formed such that a pitch length Ly between the Si pillars 4a and 4b and the Si pillars 4c and 4d in the Y direction is larger than a pitch length Lx between the Si pillars 4a and 4c and the Si pillars 4b and 4d in the X direction. In addition, the device is formed such that a gap Lg is generated between the side surface of the $SiO_2$ layer 13 surrounding the side surfaces of the $Si_3N_4$ layers 2a and 2b and the side surface of the $SiO_2$ layer 13 surrounding the side surfaces of the $Si_3N_4$ layers 2c and 2d. As a result, spaces 15a and 15b are formed below the $Si_3N_4$ layers 2a, 2b, 2c, and 2d and in outer peripheral portions of the $SiO_2$ layer 13. An upper portion of the space 15a along line X-X' is closed by the $Si_3N_4$ layer 12 and the $SiO_2$ layer 13. In contrast, an upper portion of the space 15b along line Y-Y' is open.

Next, as illustrated in FIGS. 2FA to 2FC, conductor material atoms of, for example, doped Si and $SiO_2$ material atoms are alternately allowed to be incident in a direction perpendicular to a surface of the i-layer substrate 1a by, for example, a bias sputtering method (refer to, for example, C. Y. Ting, V. J. Vivalda, and H. G. Schaefer: "Study of planarized sputter-deposited $SiO_2$,", J. Vac. Sci. Technol. 15(3), p.p. 1105-1112, May/June (1978), and A. D. G. Stewart, and M. W. Thomson: "Microtopography of Surface Eroded by Ion-Bombardment", Journal of Material Science 4, p.p. 56-69 (1969)) to form conductor layers 16a1, 16a2, 16an, 16b1, 16b2, 16bn, 16c1, 16c2, and 16cn formed of, for example, doped Si and $SiO_2$ layers 17a1, 17a2, 17an, 17b1, 17b2, 17bn, 17c1, 17c2, and 17cn on outer peripheries of the Si pillars 4a, 4b, 4c, and 4d. Since the upper portion of the space 15a along line X-X' is closed by the $SiO_2$ layer 13, the conductor layers 16a1, 16a2, and 16an, the conductor layers 16b1, 16b2, and 16bn, and the conductor layers 16c1, 16c2, and 16cn are separately formed. Similarly, the $SiO_2$ layers 17a1, 17a2, and 17an, the $SiO_2$ layers 17b1, 17b2, and 17bn, and the $SiO_2$ layers 17c1, 17c2, and 17cn are separately formed. The $SiO_2$ layer 13 around the $Si_3N_4$ layers 2a, 2b, 2c, and 2d respectively protrude from the $SiO_2$ layer 13 around the Si pillars 4a, 4b, 4c, and 4d in the outer peripheral direction. Accordingly, when the conductor material atoms and the $SiO_2$ material atoms are allowed to be incident in the direction perpendicular to the surface of the i-layer substrate 1a, the conductor layers and the $SiO_2$ layers are formed so that the side surfaces of the conductor layers 16a1, 16a2, 16an, 16b1, 16b2, 16bn, 16c1, 16c2, and 16cn and the side surfaces of the $SiO_2$ layers 17a1, 17a2, 17an, 17b1, 17b2, 17bn, 17c1, 17c2, and 17cn are not in contact with the side surface of the $SiO_2$ layer 13. In addition, conductor layers 18a1, 18a2, and 18an and $SiO_2$ layers 19a1, 19a2, and 19an are alternately stacked on the $SiO_2$ layer 13 disposed above the Si pillars 4a and 4b. Similarly, conductor layers 18b1, 18b2, and 18bn and $SiO_2$ layers 19b1, 19b2, and 19bn are formed on the $SiO_2$ layer 13 disposed above the Si pillars 4c and 4d.

Next, as illustrated in FIGS. 2GA to 2GC, a $HfO_2$ layer 20 is formed over the entire surface by, for example, ALD. In this case, the $HfO_2$ layer 20 covers the side surfaces of the conductor layers 16a1, 16a2, 16an, 16b1, 16b2, 16bn, 16c1, 16c2, and 16cn and $SiO_2$ layers 17a1, 17a2, 17an, 17b1, 17b2, 17bn, 17c1, 17c2, and 17cn and the top surfaces of the $SiO_2$ layers 17an, 17bn, and 17cn, and fills the space 15a between the side surfaces of the $SiO_2$ layer 13. The space 15b disposed below the conductor layers 18a1, 18a2, and 18an is also filled with the $HfO_2$ layer 20.

Figure 2H:
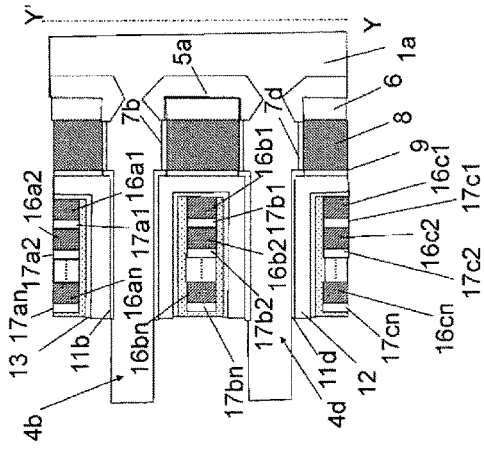
FIG. 2HA and FIGS. 2HB and 2HC are respectively a plan view and sectional structural views illustrating a method for producing a vertical NAND flash memory device according to the first embodiment.
Figure 2H:
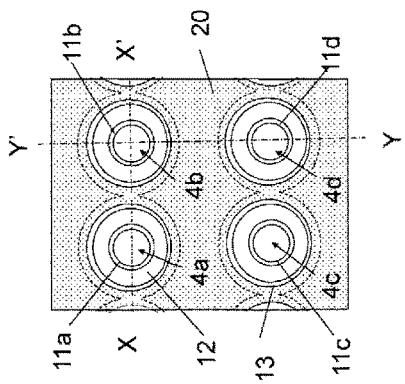
Figure 2H:
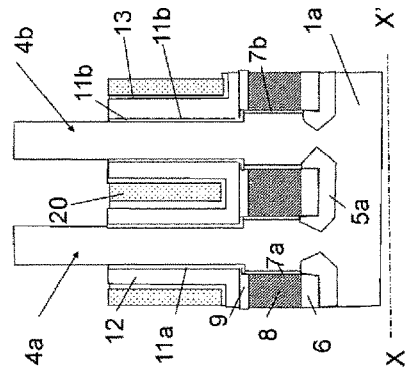
Figure 21A:
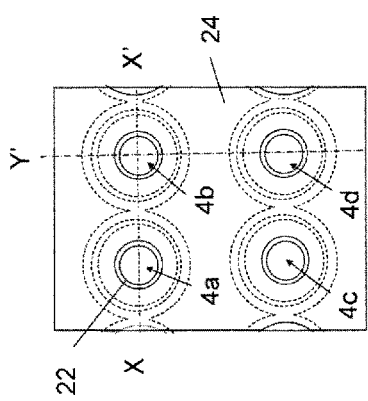
Figure 21C:
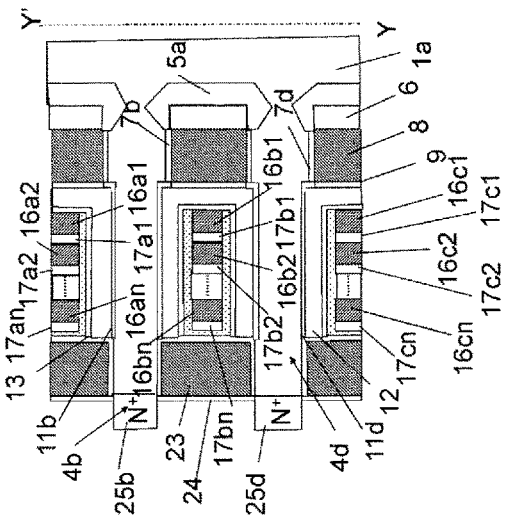
Figure 21B:
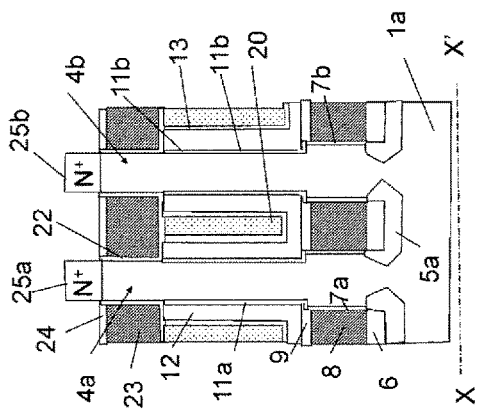

Next, as illustrated in FIGS. 2HA to 2HC, while a part of the $HfO_2$ layer 20 on the $SiO_2$ layers 17an, 17bn, and 17cn is left, the $HfO_2$ layer 20, the conductor layers 18a1, 18a2, 18an, 18b1, 18b2, and 18bn and the $SiO_2$ layers 19a1, 19a2, 19an, 19b1, 19b2, and 19bn, the $SiO_2$ layer 13, the $Si_3N_4$ layer 12, the $SiO_2$ layers 11a, 11b, 11c, and 11d, and the $Si_3N_4$ layers 2a, 2b, 2c, and 2d, all of which are disposed above the part of the $HfO_2$ layer 20 on the $SiO_2$ layers 17an, 17bn, and 17cn and cover the Si pillars 4a, 4b, 4c, and 4d, are removed using, for example, a resist (not illustrated) as a mask. As a result, upper portions of the Si pillars 4a, 4b, 4c, and 4d are exposed.

Next, as illustrated in FIGS. 2IA to 2IC, a HfO$_2$ layer 22 is formed so as to cover the top of the HfO$_2$ layer 20 disposed on outer peripheral portions of the Si pillars 4a, 4b, 4c, and 4d and top portions of the Si pillars 4a, 4b, 4c, and 4d. Subsequently, a doped Si layer 23 and a SiO$_2$ layer 24 are formed by, for example, a bias sputtering method. The HfO$_2$ layer 22 disposed on top portions of the Si pillars 4a, 4b, 4c, and 4d is then removed. Subsequently, N$^+$ layers 25a, 25b, 25c, and 25d (the N$^+$ layer 25c is not illustrated in the figures) are formed in the top portions of the Si pillars 4a, 4b, 4c, and 4d by, for example, arsenic (As) ion implantation.

Next, as illustrated in FIGS. 2JA to 2JC, resist layers 30a and 30b extending in the lateral direction in FIG. 2JA are formed by lithography so as to cover the Si pillars 4a, 4b, 4c, and 4d. The resist layer 30a covers the Si pillars 4a and 4b and extends in the lateral direction (X-X' direction) as illustrated in FIG. 2JA. The resist layer 30b covers the Si pillars 4c and 4d and extends in the lateral direction (X-X' direction) as illustrated in FIG. 2JA. Subsequently, the SiO$_2$ layer 24 and the doped Si layer 23 are etched from the upper surface by RIE using the resist layers 30a and 30b as a mask. As a result, a SiO$_2$ layer 24a and a doped Si layer 23a are formed under the resist layer 30a. At the same time, a SiO$_2$ layer 24b and a doped Si layer 23b are formed under the resist layer 30b. The resist layers 30a and 30b are then removed.

Figure 2K:
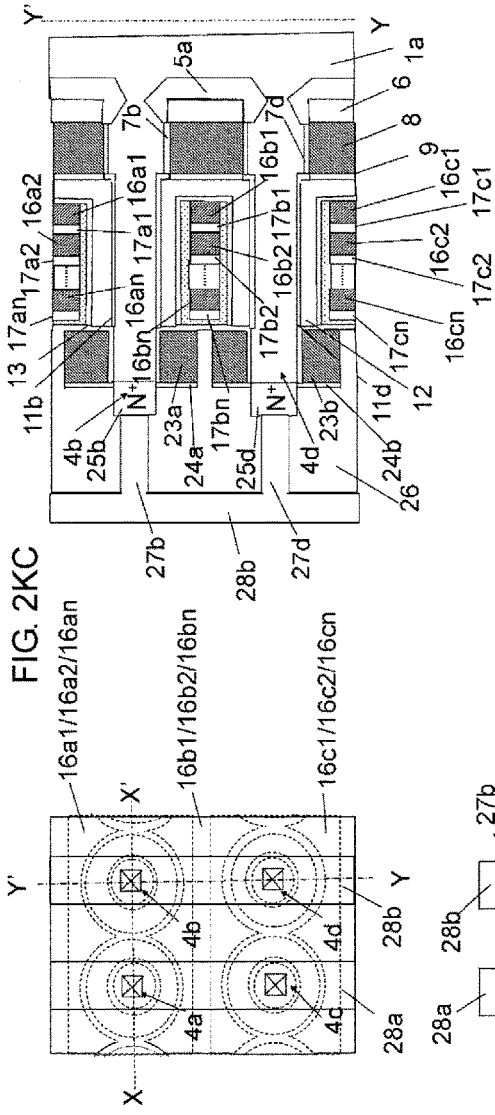
FIG. 2KA and FIGS. 2KB and 2KC are respectively a plan view and sectional structural views illustrating a method for producing a vertical NAND flash memory device according to the first embodiment.

Next, as illustrated in FIGS. 2KA to 2KC, a SiO$_2$ layer 26 is deposited by chemical vapor deposition (CVD) over the entire surface, and contact holes 27a, 27b, 27c, and 27d (the contact hole 27c is not illustrated in the figures) are formed on the Si pillars 4a, 4b, 4c, and 4d, respectively. Subsequently, metal wiring layers 28a and 28b that are connected to the N$^+$ layers 25a, 25b, 25c, and 25d through the contact holes 27a, 27b, 27c, and 27d, respectively, are formed so as to extend in a longitudinal direction (Y-Y' direction) in plan view, as illustrated in FIG. 2KA. The metal wiring layer 28a is connected to the N$^+$ layers 25a and 25c (the N$^+$ layer 25c is not illustrated in the figures) that are respectively formed on the Si pillars 4a and 4c. The metal wiring layer 28b is connected to the N$^+$ layers 25b and 25d that are respectively formed on the Si pillars 4b and 4d. A vertical NAND flash memory device in which two NAND-type flash memory elements are formed on each of the Si pillars 4a, 4b, 4c, and 4d is formed as described above.

In FIGS. 2KA to 2KC, the N$^+$ layer 5a functions as a common source, the doped Si layer 8 functions as a source-side selection line, the conductor layers 16a1, 16a2, 16an, 16b1, 16b2, 16bn, 16c1, 16c2, and 16cn function as word lines, the doped Si layers 23a and 23b function as drain-side selection lines, the N$^+$ layers 25a, 25b, 25c, and 25d function as drains, and the metal wiring layers 28a and 28b function as bit lines. The SiO$_2$ layers 11a, 11b, 11c, and 11d function as tunnel insulating layers. The Si$_3$N$_4$ layer 12 functions as a data charge storage insulating layer. The SiO$_2$ layer 13 and the HfO$_2$ layer 20 function as interlayer insulating layers.

As illustrated in FIGS. 2KA to 2KC, a vertical NAND flash memory device in which two NAND-type flash memory elements are provided on each of the Si pillars 4a, 4b, 4c, and 4d is formed. With this structure, a high integration and a reduction in the cost of the NAND-type flash memory device can be realized.

According to the first embodiment, the following advantages are further achieved.

Figure 8:
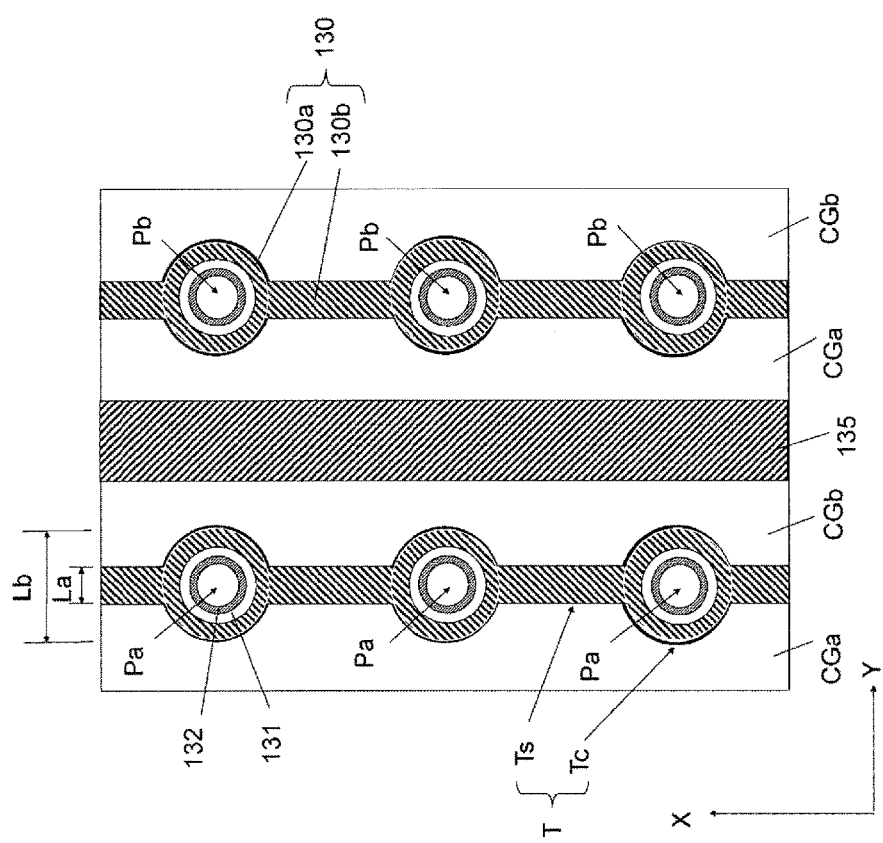
FIG. 8 is a plan view of an example of a vertical NAND flash memory device in the related art, the flash memory device including word-line conductor layers disposed on two sides of an outer peripheral portion of a poly-Si pillar, and two NAND-type flash memory elements that are formed on two poly-Si pillars in a connecting manner.

1. In plan view, between the Si pillars 4a and 4b and between the Si pillars 4c and 4d arranged in the X-X' direction, the shapes of the conductor layers 16a1, 16a2, 16an, 16b1, 16b2, 16bn, 16c1, 16c2, and 16cn and the SiO$_2$ layers 17a1, 17a2, 17an, 17b1, 17b2, 17bn, 17c1, 17c2, and 17cn, all of which face the Si pillars 4a, 4b, 4c, and 4d, are circular arc shapes. In the X-X' direction, these circular arcs are in contact with each other between the adjacent Si pillars 4a, 4b, 4c, and 4d. Accordingly, it is not necessary to provide the rectangular hole Ts filled with the interlayer insulating layer 130b (corresponding to the HfO$_2$ layer 20 in the present embodiment) in the semiconductor memory device in the related art illustrated in FIG. 8. Consequently, a significantly high integration of the NAND-type flash memory device is achieved in the present embodiment.

2. As illustrated in FIGS. 2FA to 2FC, after the SiO$_2$ layers 11a, 11b, 11c, and 11d functioning as tunnel insulating layers, the Si$_3$N$_4$ layer 12 functioning as a data charge storage insulating layer, and the SiO$_2$ layer 13 functioning as an interlayer insulating layer are formed so as to surround the Si pillars 4a, 4b, 4c, and 4d, conductor material atoms and SiO$_2$ material atoms are allowed to be incident in a direction perpendicular to the surface of the i-layer substrate 1a by a bias sputtering method. Thus, the conductor layers 16a1, 16a2, 16an, 16b1, 16b2, 16bn, 16c1, 16c2, and 16cn and the SiO$_2$ layers 17a1, 17a2, 17an, 17b1, 17b2, 17bn, 17c1, 17c2, and 17cn are formed on outer peripheries of the Si pillars 4a, 4b, 4c, and 4d. In this case, since the Si$_3$N$_4$ layers 2a, 2b, 2c, and 2d, and the Si$_3$N$_4$ layer 12 and the SiO$_2$ layer 13 that surround the side surfaces of the Si$_3$N$_4$ layers 2a, 2b, 2c, and 2d function as a mask, the conductor material atoms and the SiO$_2$ material atoms that are incident in a direction perpendicular to the surface of the i-layer substrate 1a are not incident on the surface of the SiO$_2$ layer 13 disposed on the side surfaces of the Si pillars 4a, 4b, 4c, and 4d. Therefore, the SiO$_2$ layers 11a, 11b, 11c, and 11d functioning as tunnel insulating layers, the Si$_3$N$_4$ layer 12 functioning as a data charge storage insulating layer, and the SiO$_2$ layer 13 functioning as an interlayer insulating layer are not damaged by the incidence of the conductor material atoms and the SiO$_2$ material atoms. As a result, defects generated in the SiO$_2$ layers 11a, 11b, 11c, and 11d, the Si$_3$N$_4$ layer 12, and the SiO$_2$ layer 13 can be reduced to improve the reliability of memory characteristics.

3. As illustrated in FIGS. 2GA to 2GC, the spaces 15a and 15b are filled with the HfO$_2$ layer 20. With this structure, the Si pillars 4a, 4b, 4c, and 4d are supported by the HfO$_2$ layer 20. Therefore, it is possible to prevent the occurrence of contamination defects due to a phenomenon in which, in a subsequent cleaning treatment step, a lithography step, and other steps, a treatment liquid enters the spaces 15a and 15b and remains in the spaces 15a and 15b without being removed. Furthermore, this structure prevents the Si pillars 4a, 4b, 4c, and 4d from tilting or bending.

Second Embodiment

A method for producing a vertical NAND flash memory device according to a second embodiment of the present invention will be described with reference to FIGS. 3AA to 3BC. The method according to the second embodiment is the same as that according to the first embodiment except for steps described with reference to FIGS. 3AA to 3BC.

Steps the same as those illustrated in FIGS. 2AA to 2IC are performed. Next, as illustrated in FIGS. 3AA to 3AC, resist layers 30a and 30b extending in the lateral direction (X-X' direction) in FIG. 2JA are formed by lithography so as to cover the Si pillars 4a, 4b, 4c, and 4d. The resist layer 30a covers the Si pillars 4a and 4b and extends in the lateral direction as illustrated in FIG. 2JA. The resist layer 30b covers the Si pillars 4c and 4d and extends in the lateral direction as illustrated in FIG. 2JA. Subsequently, the SiO$_2$ layer 24, the doped Si layer 23, the conductor layers 16a1, 16a2, 16an, 16b1, 16b2, 16bn, 16c1, 16c2, and 16cn, and the SiO₂ layers 17a1, 17a2, 17an, 17b1, 17b2, 17bn, 17c1, 17c2, and 17cn are etched from the upper surface by RIE using the resist layers 30a and 30b as a mask. As a result, a SiO₂ layer 24a, a doped Si layer 23a, SiO₂ layers 17d1, 17d2, 17dn, 17e1, 17e2, and 17en, and conductor layers 16d1, 16d2, 16dn, 16e1, 16e2, and 16en are formed under the resist layer 30a. Similarly, a SiO₂ layer 24b, a doped Si layer 23b, SiO₂ layers 17f1, 17f2, 17fn, 17g1, 17g2, and 17gn, and conductor layers 16f1, 16f2, 16fn, 16g1, 16g2, and 16gn are formed under the resist layer 30b. The resist layers 30a and 30b are then removed.

Next, as illustrated in FIGS. 3BA to 3BC, a SiO₂ layer 26 is deposited by CVD over the entire surface, and contact holes 27a, 27b, 27c, and 27d (the contact hole 27c is not illustrated in the figures) are formed on the Si pillars 4a, 4b, 4c, and 4d, respectively. Subsequently, metal wiring layers 28a and 28b that are connected to the N⁺ layers 25a, 25b, 25c, and 25d (the N⁺ layers 25c is not illustrated in the figures) through the contact holes 27a, 27b, 27c, and 27d, respectively, are formed so as to extend in a longitudinal direction (Y-Y' direction) as illustrated in FIG. 3BA. The metal wiring layer 28a is connected to the N⁺ layers 25a and 25c that are respectively formed on the Si pillars 4a and 4c. The metal wiring layer 28b is connected to the N⁺ layers 25b and 25d that are respectively formed on the Si pillars 4b and 4d. A vertical NAND flash memory device in which two NAND-type flash memory elements are formed on each of the Si pillars 4a, 4b, 4c, and 4d is formed as described above.

In the NAND-type flash memory device of the present embodiment, the conductor layers 16d1, 16d2, and 16dn, the conductor layers 16e1, 16e2, and 16en, the conductor layers 16f1, 16f2, and 16fn, and the conductor layers 16g1, 16g2, and 16gn are operated as word lines of NAND-type flash memory elements that are independent from each other. In the description of the first embodiment, as illustrated in FIGS. 2KA to 2KC, the conductor layers 16b1, 16b2, and 16bn function as word lines of NAND-type flash memory elements formed on channels of the Si pillars 4a, 4b, 4c, and 4d, the channels facing the side surfaces of the conductor layers 16b1, 16b2, and 16bn. Therefore, for example, when a writing or read-out operation of the NAND-type flash memory elements of the Si pillars 4a and 4b is performed, a writing or read-out voltage is also applied to the word lines (the conductor layers 16b1, 16b2, and 16bn) of NAND-type flash memory elements of the Si pillars 4c and 4d (in this case, the drain-side selection transistors of the NAND-type flash memory elements of the Si pillars 4c and 4d are in an off state). A shift of the threshold voltage due to this application of the writing or read-out voltage may decrease the reliability characteristics of the NAND-type flash memory elements. In contrast, in the present embodiment, the conductor layers 16d1, 16d2, and 16dn, the conductor layers 16e1, 16e2, and 16en, the conductor layers 16f1, 16f2, and 16fn, and the conductor layers 16g1, 16g2, and 16gn are connected to word lines that are electrically independent from each other, and thus a decrease in reliability as described above does not occur.

Third Embodiment

Figure 4A:
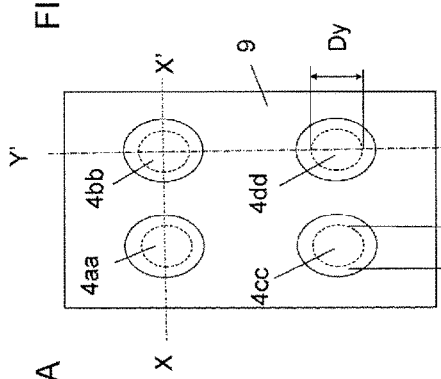
FIG. 4AA and FIGS. 4AB and 4AC are respectively a plan view and sectional structural views illustrating a method for producing a vertical NAND flash memory device according to a third embodiment of the present invention.
Figure 4A:
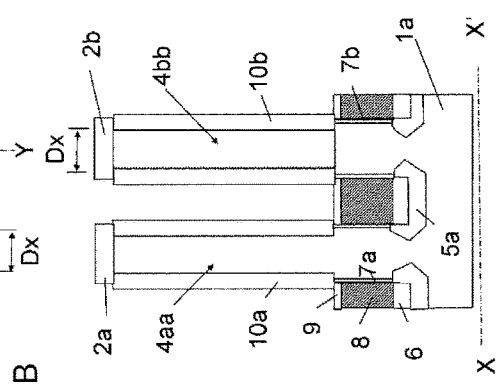
Figure 4A:
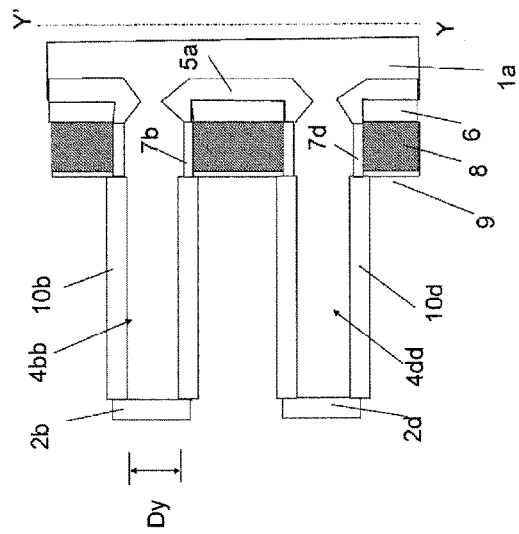

A method for producing a vertical NAND flash memory device according to a third embodiment of the present invention will be described with reference to FIGS. 4AA to 4AC and FIG. 4B. The method according to the third embodiment is the same as that according to the first embodiment except for a step described with reference to FIGS. 4AA to 4AC and FIG. 4B.

Steps the same as those illustrated in FIGS. 2AA to 2CC are performed. Subsequently, as illustrated in FIGS. 4AA and 4AC, Si pillars 4aa, 4bb, 4cc, and 4dd each having an elliptical cross-sectional shape are formed. The Si pillars 4aa, 4bb, 4cc, and 4dd are formed by changing the cross-sectional shape of the Si pillars 4a, 4b, 4c, and 4d to an elliptical shape. In this elliptical shape, Dy is larger than Dx where Dx represents a length in a direction of line X-X' and Dy represents a length in a direction of line Y-Y'. Subsequently, steps the same as those illustrated in FIGS. 2DA to 2KC are performed. As a result, a vertical NAND flash memory device in which two NAND-type flash memory elements are formed on each of the Si pillars 4aa, 4bb, 4cc, and 4dd is formed as in the first embodiment.

Figure 4B:
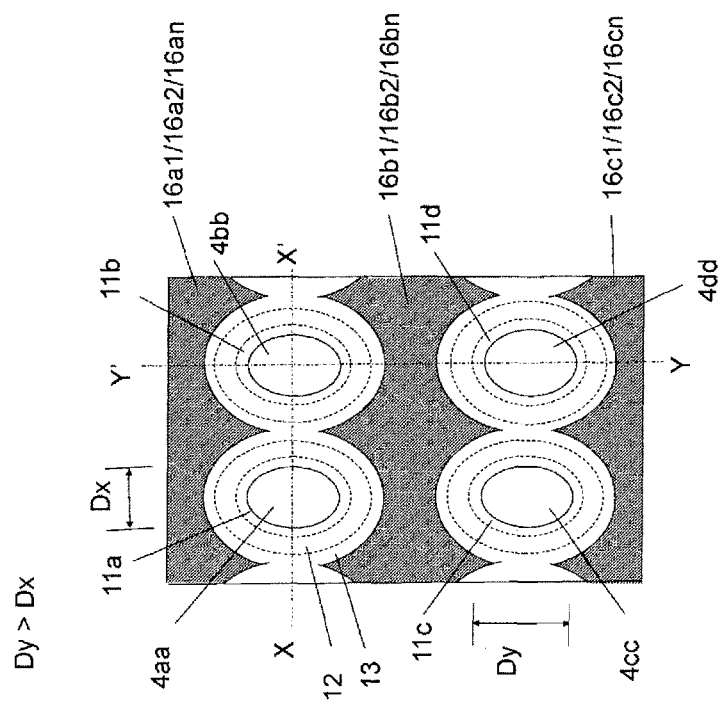
FIG. 4B is a plan view illustrating a method for producing a vertical NAND flash memory device according to the third embodiment of the present invention.

FIG. 4B is a plan view illustrating the relationship between the Si pillars 4aa, 4bb, 4cc, and 4dd and conductor layers 16a1, 16a2, 16an, 16b1, 16b2, 16bn, 16c1, 16c2, and 16cn functioning as word lines. Silicon dioxide (SiO₂) layers 11a, 11 b, 11c, and 11d functioning as tunnel insulating layers are formed so as to surround the Si pillars 4aa, 4bb, 4cc, and 4dd. A Si₃N₄ layer 12 functioning as a data charge storage insulating layer is formed so as to surround the SiO₂ layers 11a, 11b, 11c, and 11d. An interlayer insulating layer 13 is formed so as to surround the Si₃N₄ layer 12. The amount of charge stored in an upper (Y' direction) portion of the plan view of the data charge storage insulating layer Si₃N₄ layer 12 surrounding the Si pillars 4aa and 4bb is controlled by the voltage applied to the conductor layers 16a1, 16a2, and 16an functioning as word lines. The amount of charge stored in a lower (Y direction) portion of the plan view of the data charge storage insulating layer Si₃N₄ layer 12 surrounding the Si pillars 4aa and 4bb is controlled by the voltage applied to the conductor layers 16b1, 16b2, and 16bn functioning as word lines.

Since the sectional shape of each of the Si pillars 4aa, 4bb, 4cc, and 4dd is an elliptical shape that is long in the Y-Y' direction, in the Si pillars 4aa and 4bb, stored charges are concentrated at the data charge storage insulating layer Si₃N₄ layer 12 facing the conductor layers 16a1, 16a2, and 16an and the conductor layers 16b1, 16b2, and 16bn. Therefore, the stored charge distribution of the data charge storage insulating layer Si₃N₄ layer 12 as a result of application of a voltage to the conductor layers 16a1, 16a2, and 16an and the conductor layers 16b1, 16b2, and 16bn can be separated from each other compared with the case where the cross-sectional shape is a circular shape. This structure can suppress a decrease in data retention characteristic caused by mixing, due to diffusion, of the stored charge distribution of the data charge storage insulating layer Si₃N₄ layer 12, the distribution being separated on the side surface side of the conductor layers 16a1, 16a2, and 16an and on the side surface side of the conductor layers 16b1, 16b2, and 16bn. This advantage is similarly obtained in the NAND-type flash memory elements formed on the Si pillars 4cc and 4dd.

Fourth Embodiment

Figure 5A:
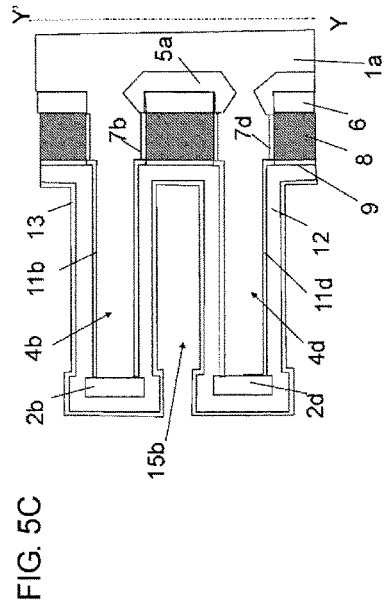
FIG. 5A and FIGS. 5B and 5C are respectively a plan view and sectional structural views illustrating a method for producing a vertical NAND flash memory device according to a fourth embodiment of the present invention.
Figure 5B:
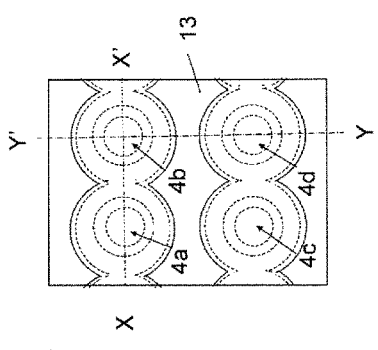
Figure 5C:
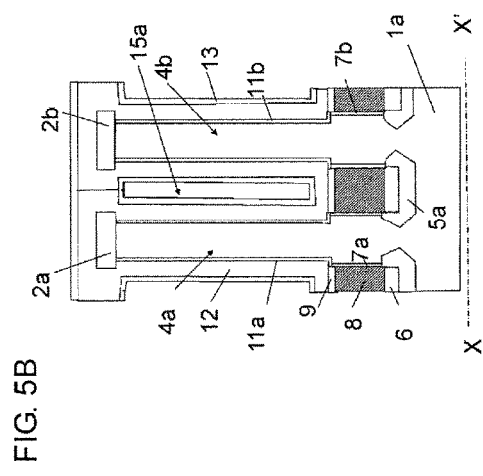
Figure 6:
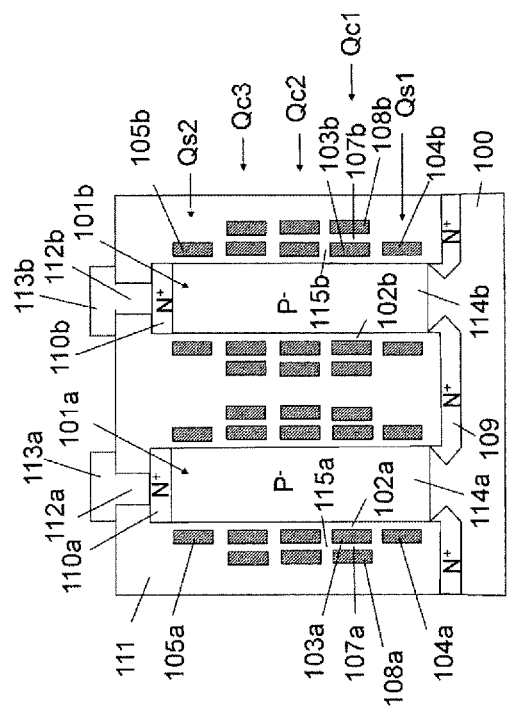
FIG. 6 is a sectional structural view of an example of a vertical NAND flash memory device in the related art.
Figure 7:
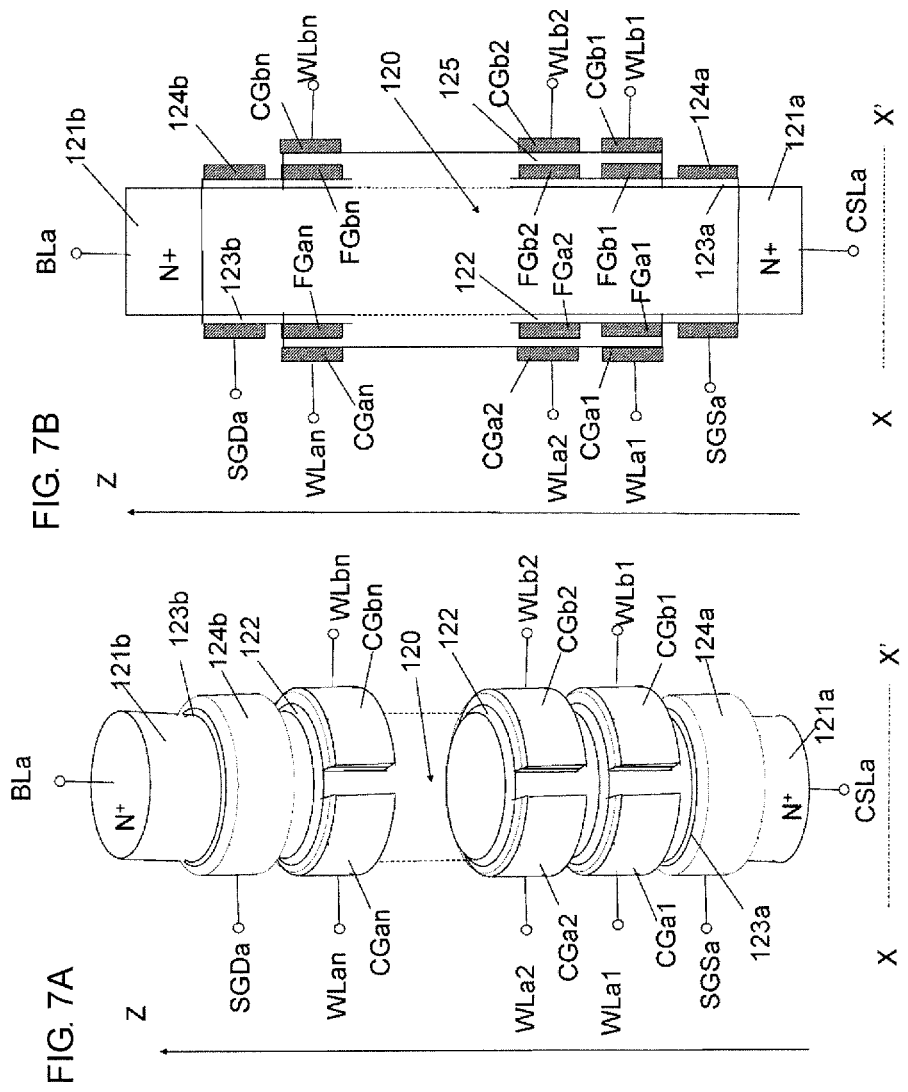
FIGS. 7A and 7B are respectively a schematic view and a sectional view of the structure of an example of a vertical NAND flash memory device in the related art, the flash memory device including a single Si pillar on which two NAND-type flash memory elements are formed.

A method for producing a vertical NAND flash memory device according to a fourth embodiment of the present invention will be described with reference to FIGS. 5A to 5C. The method according to the fourth embodiment is the same as that according to the first embodiment except for a step described with reference to FIGS. 5A to 5C.

Steps the same as those illustrated in FIGS. 2AA to 2EC are performed. Subsequently, as illustrated in FIGS. 5A to 5C, SiO₂ layers 11a, 11b, 11c, and 11d (the SiO₂ layer 11c is not illustrated in the figures) which are to become tunnel insulating layers are respectively formed by, for example, a thermal oxidation method in surface layers of the side surfaces of the Si pillars 4a, 4b, 4c, and 4d. Subsequently, a $Si_3N_4$ layer 12 which is to become a data charge storage insulating layer and a $SiO_2$ layer 13 which is to become an interlayer insulating layer are formed by ALD so as to cover the whole surface. As illustrated in FIG. 5B, along line X-X', a part of the $SiO_2$ layer 13 surrounding the side surfaces of the $Si_3N_4$ layers 2a and 2b is formed such that parts of the $Si_3N_4$ layer 12 surrounding the side surfaces of the $Si_3N_4$ layers 2a and 2b are in contact with each other between the Si pillars 4a and 4b. Similarly, a part of the $SiO_2$ layer 13 surrounding the side surfaces of the $Si_3N_4$ layers 2c and 2d is formed such that parts of the $Si_3N_4$ layer 12 surrounding the side surfaces of the $Si_3N_4$ layers 2c and 2d are in contact with each other between the Si pillars 4c and 4d. As illustrated in FIG. 5C, along line Y-Y', the part of the $SiO_2$ layer 13 surrounding the side surfaces of the $Si_3N_4$ 2a and 2b is formed separately from the part of the $SiO_2$ layer 13 surrounding the side surfaces of the $Si_3N_4$ layers 2c and 2d.

In FIGS. 2EA to 2EC, along line X-X', a part of the $SiO_2$ layer 13 surrounding the side surfaces of the $Si_3N_4$ layers 2a and 2b is formed such that parts of the $SiO_2$ layer 13 surrounding the side surfaces of the $Si_3N_4$ layers 2a and 2b are in contact with each other between the Si pillars 4a and 4b. In contrast, in the fourth embodiment, a part of the $SiO_2$ layer 13 surrounding the side surfaces of the $Si_3N_4$ layers 2a and 2b is formed such that parts of the $Si_3N_4$ layer 12 surrounding the side surfaces of the $Si_3N_4$ layers 2a and 2b are in contact with each other between the Si pillars 4a and 4b. In this manner, an upper portion of the space 15a along line X-X' is closed by the $Si_3N_4$ layer 12. Accordingly, by alternately allowing conductor material atoms of a doped Si layer and $SiO_2$ material atoms to be incident in a direction perpendicular to a surface of the i-layer substrate 1a as in the first embodiment, conductor layers 16a1, 16a2, and 16an, conductor layers 16b1, 16b2, and 16bn, and conductor layers 16c1, 16c2, and 16cn, which are separated from each other, can be formed. Similarly, $SiO_2$ layers 17a1, 17a2, and 17an, $SiO_2$ layers 17b1, 17b2, and 17bn, and $SiO_2$ layers 17c1, 17c2, and 17cn, which are separated from each other, can be formed.

In the first embodiment, a description has been made of an application to a vertical NAND flash memory device in which two n-stage NAND-type flash memory elements that are connected in parallel are formed on each of the Si pillars 4a, 4b, 4c, and 4d. The present invention is also applicable to other electrically erasable programmable read only memory (EEPROM) devices, such as NOR-type memory devices, in which two one-stage elements that are connected in parallel are formed on each of the Si pillars 4a, 4b, 4c, and 4d. This is also similarly applicable to other embodiments of the present invention.

In the description of the first embodiment, doped Si layers are used as the conductor layers 16a1, 16a2, 16an, 16b1, 16b2, 16bn, 16c1, 16c2, and 16cn. Alternatively, the conductor layers may be formed of other conductor layers such as silicide layers or metal layers, e.g., Ti layers or TiN layers. This is also similarly applicable to other embodiments of the present invention.

In the first embodiment, as illustrated in FIG. 2EA to 2EC, the $SiO_2$ layer 13 functioning as an interlayer insulating layer is formed so as to surround the $Si_3N_4$ layer 12 functioning as a data charge storage insulating layer. This $SiO_2$ layer 13 has a function of ensuring an insulating property between the $Si_3N_4$ layer 12 functioning as a data charge storage insulating layer and each of the conductor layers 16a1, 16a2, 16an, 16b1, 16b2, 16bn, 16c1, 16c2, and 16cn. The $HfO_2$ layer 20, which is an insulating layer, is disposed between the $Si_3N_4$ layer 12 and each of the conductor layers 16a1, 16a2, 16an, 16b1, 16b2, 16bn, 16c1, 16c2, and 16cn. Accordingly, when a necessary insulating property can be ensured by forming the $HfO_2$ layer 20 alone, the formation of the $SiO_2$ layer 13 is not essential. In this case, the $Si_3N_4$ layer 12 is formed such that parts of the $Si_3N_4$ layer 12 are in contact with each other between the Si pillars 4a and 4b and between the Si pillars 4c and 4d. This is also similarly applicable to other embodiments of the present invention.

In the first embodiment, conductor material atoms and $SiO_2$ material atoms are allowed to be incident in a direction perpendicular to the upper surface of the i-layer substrate 1a by a bias sputtering method to form the conductor layers 16a1, 16a2, 16an, 16b1, 16b2, 16bn, 16c1, 16c2, and 16cn, and the $SiO_2$ layers 17a1, 17a2, 17an, 17b1, 17b2, 17bn, 17c1, 17c2, and 17cn on outer peripheries of the Si pillars 4a, 4b, 4c, and 4d. Alternatively, other methods may be used as long as the conductor layers 16a1, 16a2, 16an, 16b1, 16b2, 16bn, 16c1, 16c2, and 16cn, and the $SiO_2$ layers 17a1, 17a2, 17an, 17b1, 17b2, 17bn, 17c1, 17c2, and 17cn can be formed by allowing conductor material atoms and $SiO_2$ material atoms to be incident in a direction perpendicular to the upper surface of the i-layer substrate 1a. This is also similarly applicable to other embodiments of the present invention.

In the first embodiment, as illustrated in FIGS. 2HA to 2HC, while a part of the $HfO_2$ layer 20 on the $SiO_2$ layers 17an, 17bn, and 17cn is left, the $HfO_2$ layer 20, the conductor layers 18a1, 18a2, 18an, 18b1, 18b2, and 18bn and the $SiO_2$ layers 19a1, 19a2, 19an, 19b1, 19b2, and 19bn, the $SiO_2$ layer 13, the $Si_3N_4$ layer 12, the $SiO_2$ layers 11a, 11b, 11c, and 11d, and the $Si_3N_4$ layers 2a, 2b, 2c, and 2d, all of which are disposed above the part of the $HfO_2$ layer 20 on the $SiO_2$ layers 17an, 17bn, and 17cn and cover the Si pillars 4a, 4b, 4c, and 4d, are removed using, for example, a resist (not illustrated) as a mask. As a result, upper portions of the Si pillars 4a, 4b, 4c, and 4d are exposed. Alternatively, for example, a layer formed of a material functioning as an etching mask for etching the $HfO_2$ layer 20 may be formed on the $SiO_2$ layers 17an, 17bn, and 17cn. Other methods may be used as long as upper portions of the Si pillars 4a, 4b, 4c, and 4d are exposed. This is also similarly applicable to other embodiments of the present invention.

The conductor layers 16a1, 16a2, 16an, 16b1, 16b2, 16bn, 16c1, 16c2, and 16cn in the first embodiment are, for example, doped Si layers. Alternatively, the conductor layers may be formed of polysilicon or amorphous silicon doped with a donor or acceptor impurity. Alternatively, the conductor layers may be silicide layers subjected to silicidation with Ni atoms, metal layers, or other layers formed of a material having conductivity. Each of the doped Si layers may be multiple layers formed of materials having conductivity. This is also similarly applicable to other embodiments of the present invention.

In the first embodiment, the conductor layers 16a1, 16a2, 16an, 16b1, 16b2, 16bn, 16c1, 16c2, and 16cn and the $SiO_2$ layers 17a1, 17a2, 17an, 17b1, 17b2, 17bn, 17c1, 17c2, and 17cn are stacked, and the $SiO_2$ layers 17an, 17bn, and 17cn are formed on the top. The formation of the $SiO_2$ layers 17an, 17bn, and 17cn may be omitted as long as an insulating property between the conductor layer 23 and each of the conductor layers 16an, 16bn, and 16cn is ensured. This is also similarly applicable to other embodiments of the present invention.

The $SiO_2$ layers 11a, 11b, 11c, and 11d functioning as tunnel insulating layers, the $Si_3N_4$ layer 12 functioning as a data charge storage insulating layer, and the SiO$_2$ layer 13 and the HfO$_2$ layer 20 functioning as interlayer insulating layers in the first embodiment may be layers formed of other materials as long as the layers can achieve the functions thereof. This is also similarly applicable to other embodiments of the present invention.

In the first embodiment, the Si$_3$N$_4$ layer 12 functioning as a data charge storage insulating layer and the SiO$_2$ layer 13 functioning as an interlayer insulating layer are formed as independent material layers. The layers are not limited thereto. For example, a Si$_3$N$_4$ layer 12 is formed, and a SiNO layer containing oxygen may subsequently be formed as an interlayer insulating layer by successively introducing oxygen gas. This is also similarly applicable to other embodiments of the present invention.

In the first embodiment, the doped Si layer 8 is used as an example of a source-side selection gate conductor layer, and the doped Si layers 23a and 23b are used as an example of drain-side selection gate conductor layers. The layers are not limited thereto and may be formed of other materials as long as the layers are conductor layers. This is also similarly applicable to other embodiments of the present invention.

In the first embodiment, NAND-type flash memory elements are formed on the Si pillars 4a, 4b, 4c, and 4d. The pillars are not limited thereto, and other semiconductor pillars may be used. This is also similarly applicable to other embodiments of the present invention.

In the first embodiment, the i-layer substrate 1 is etched by, for example, RIE using both the resist layers 3a, 3b, 3c, and 3d and the Si$_3$N$_4$ layers 2a, 2b, 2c, and 2d as a mask to form the Si pillars 4a, 4b, 4c, and 4d, respectively. The method is not limited thereto. The i-layer substrate 1 may be etched by using only the resist layers 3a, 3b, 3c, and 3d or the Si$_3$N$_4$ layers 2a, 2b, 2c, and 2d without using both the resist layers 3a, 3b, 3c, and 3d and the Si$_3$N$_4$ layers 2a, 2b, 2c, and 2d. Alternatively, a layer formed of another material may be used as long as the layer can achieve the function of the resist layers 3a, 3b, 3c, and 3d and the Si$_3$N$_4$ layers 2a, 2b, 2c, and 2d. The layer formed of the other material may have a multilayer structure. This is also similarly applicable to other embodiments of the present invention.

In the first embodiment, the spaces 15a and 15b are filled with the HfO$_2$ layer 20. Alternatively, any insulating layer formed of a material other than HfO$_2$ may be used instead of the HfO$_2$ layer 20 as long as the insulating layer fills the spaces 15a and 15b. This is also similarly applicable to other embodiments of the present invention.

It is to be understood that various embodiments and modifications of the present invention can be made without departing from the broad spirit and the scope of the present invention. The embodiments described above are illustrative examples of the present invention and do not limit the scope of the present invention. The examples and modifications may be combined as required. Furthermore, some of constituent features of the above embodiments may be omitted as required. Such embodiments are also included in the technical scope of the present invention.

According to the present invention, a pillar-shaped semiconductor memory device having a high density and a low cost, and a high-performance, new-function electronic device using the pillar-shaped semiconductor memory device are provided.

What is claimed is:

1. A pillar-shaped semiconductor memory device comprising:
   a semiconductor substrate;
   semiconductor pillars on the semiconductor substrate, extending in a direction perpendicular to a surface of the semiconductor substrate, and in at least two rows;
   a tunnel insulating layer surrounding an outer periphery of each of the semiconductor pillars;
   a data charge storage insulating layer surrounding an outer periphery of the tunnel insulating layer;
   a first interlayer insulating layer surrounding an outer periphery of the data charge storage insulating layer; and
   a first stacked material layer and a second stacked material layer that are on the semiconductor substrate so that one row of the semiconductor pillars is interposed between the first stacked material layer and a second stacked material layer,
   the first stacked material layer being at least one laminate including, as one set,
      a first conductor layer surrounding a part of an outer periphery of the first interlayer insulating layer of the semiconductor pillars in the one row, and
      a second interlayer insulating layer on or under the first conductor layer, and
   the second stacked material layer being at least one laminate including, as one set,
      a second conductor layer surrounding another part of the outer periphery of the first interlayer insulating layer of the semiconductor pillars in the one row, and at the same position as that of the first conductor layer in the direction perpendicular to the surface of the semiconductor substrate, and
      a third interlayer insulating layer on or under the second conductor layer,
   wherein a pitch length between semiconductor pillars adjacent to each other in the one row of the semiconductor pillars is smaller than a pitch length between a semiconductor pillar in the one row and a semiconductor pillar in a row other than the one row,
   in plan view, shapes of the first conductor layer and the second conductor layer, the shapes facing the semiconductor pillars, are semicircular arcs, and, between the semiconductor pillars adjacent to each other, the semicircular arcs of the first conductor layer are in contact with each other and the semicircular arcs of the second conductor layer are in contact with each other,
   in plan view, the first interlayer insulating layer is between a contact point of the semicircular arcs of the first conductor layer and a contact point of the semicircular arcs of the second conductor layer, the first interlayer insulating layer is connected to upper surfaces of the stacked material layer and the second stacked material layer, and
   data writing and erasing due to a data charge transfer between the semiconductor pillars and the data charge storage insulating layer through the tunnel insulating layer or a data charge retention by the data charge storage insulating layer is performed by application of a voltage to the first conductor layer and the second conductor layer.

2. The pillar-shaped semiconductor memory device according to claim 1, further comprising, a fourth interlayer insulating layer between the data charge storage insulating layer and the first interlayer insulating layer.

3. The pillar-shaped semiconductor memory device according to claim 1, wherein, in addition to the one row, the other row of the semiconductor pillars, the other row being adjacent to the one row, is interposed between the first stacked material layer and the second stacked material layer in plan view, the second conductor layer adjacent to the one row and the first conductor layer adjacent to the other row face each other, and the second conductor layer adjacent to the one row is connected to the first conductor layer adjacent to the other row.

4. The pillar-shaped semiconductor memory device according to claim 1, wherein, in addition to the one row, the other row of the semiconductor pillars, the other row being adjacent to the one row, is interposed between the first stacked material layer and the second stacked material layer in plan view, the second conductor layer adjacent to the one row and the first conductor layer adjacent to the other row face each other, and the second conductor layer adjacent to the one row is separated from the first conductor layer adjacent to the other row.

5. The pillar-shaped semiconductor memory device according to claim 1, wherein a section of each of the semiconductor pillars in plan view has an elliptical shape, in plan view, a minor axis of the elliptical shape extends in a direction in which the semiconductor pillars extend in the one row, and a major axis of the elliptical shape extends in a direction perpendicular to the direction in which the semiconductor pillars extend in the one row.

6. The pillar-shaped semiconductor memory device according to claim 1, further comprising:
 a first impurity layer in a lower portion of each of the semiconductor pillars and containing a donor or acceptor impurity;
 a first gate insulating layer that surrounds the semiconductor pillar above the first impurity layer and that is in contact with the tunnel insulating layer;
 a first gate conductor layer that surrounds the first gate insulating layer and that is adjacent to the first conductor layer and the second conductor layer;
 a second impurity layer in an upper portion of the semiconductor pillar and having the same conductivity type as the first impurity layer,
 a second gate insulating layer that surrounds the semiconductor pillar below the second impurity layer and that is in contact with the tunnel insulating layer; and
 a second gate conductor layer that surrounds the second gate insulating layer and that is adjacent to the first conductor layer and the second conductor layer.

7. A method for producing a pillar-shaped semiconductor memory device, the method comprising:
 a circular insulating layer-forming step of forming a circular insulating layer on a semiconductor substrate;
 a semiconductor pillar-forming step of etching the semiconductor substrate using the circular insulating layer as a mask to form semiconductor pillars on the semiconductor substrate in at least two rows such that an arrangement pitch length between semiconductor pillars adjacent to each other in a row of the semiconductor pillars is smaller than an arrangement pitch length between semiconductor pillars arranged in adjacent two rows;
 a semiconductor pillar outer periphery retraction-forming step of, in plan view, retracting an outer periphery of each of the semiconductor pillars from an outer periphery of the circular insulating layer toward the inside;
 a tunnel insulating layer-forming step of forming a tunnel insulating layer that surrounds an outer periphery of each of the semiconductor pillars;
 a data charge storage insulating layer-forming step of forming a data charge storage insulating layer that covers the tunnel insulating layer and the circular insulating layer;
 a first conductor layer/second conductor layer-forming step of, using the data charge storage insulating layer on the circular insulating layer as a mask, allowing conductor material atoms to be incident in a direction perpendicular to a surface of the semiconductor substrate to form a first conductor layer and a second conductor layer above the semiconductor substrate and on the data charge storage insulating layer on the circular insulating layer in plan view;
 a first interlayer insulating layer/second interlayer insulating layer-forming step of, using the data charge storage insulating layer on the circular insulating layer as a mask, allowing insulating material atoms to be incident in the direction perpendicular to the surface of the semiconductor substrate to form a first interlayer insulating layer on or under the first conductor layer and a second interlayer insulating layer on or under the second conductor layer; and
 a third interlayer insulating layer-forming step of forming a third interlayer insulating layer between an outer peripheral side surface of the data charge storage insulating layer surrounding each of the semiconductor pillars and side surfaces of the first conductor layer and the first interlayer insulating layer and between the outer peripheral side surface of the data charge storage insulating layer surrounding each of the semiconductor pillars and side surfaces of the second conductor layer and the second interlayer insulating layer,
 wherein, in the data charge storage insulating layer-forming step, in plan view, an outer edge of the data charge storage insulating layer on the side surfaces of the circular insulating layers on semiconductor pillars adjacent to each other in one row of the semiconductor pillars is formed to have semicircular arc shapes that are connected in contact with each other, and
 in the first conductor layer/second conductor layer-forming step, the first conductor layer and the second conductor layer are formed to extend such that the one row of the semiconductor pillars is interposed between the first conductor layer and the second conductor layer in plan view.

8. The method according to claim 7, further comprising:
 before the third interlayer insulating layer-forming step, a fourth interlayer insulating layer-forming step of forming a fourth interlayer insulating layer so as to surround the data charge storage insulating layer,
 wherein, in plan view, the outer edge of the data charge storage insulating layer or the fourth interlayer insulating layer is formed to have semicircular arc shapes that are connected in contact with each other between the side surfaces of the circular insulating layers on semiconductor pillars that are adjacent to each other in the one row of the semiconductor pillars.

9. The method according to claim 7, wherein the third interlayer insulating layer is formed so as to be connected to upper surfaces of stacked material layers including the first conductor layer, the second conductor layer, the first interlayer insulating layer, and the second interlayer insulating layer.

10. The method according to claim 7, wherein, in the first conductor layer/second conductor layer-forming step, the first conductor layer and the second conductor layer are formed to extend such that, in addition to the one row, a row other than the one row of the semiconductor pillars, the other row being adjacent to the one row, is interposed between the first conductor layer and the second conductor layer in plan view, the second conductor layer disposed adjacent to the one row and the first conductor layer disposed adjacent to the other row face each other, and the second conductor layer disposed adjacent to the one row is connected to the first conductor layer disposed adjacent to the other row.

11. The method according to claim 7, wherein, in the first conductor layer/second conductor layer-forming step, the first conductor layer and the second conductor layer are formed to extend such that, in addition to the one row, a row other than the one row of the semiconductor pillars, the other row being adjacent to the one row, is interposed between the first conductor layer and the second conductor layer in plan view, the second conductor layer disposed adjacent to the one row and the first conductor layer disposed adjacent to the other row face each other, and the second conductor layer disposed adjacent to the one row is separated from the first conductor layer disposed adjacent to the other row.

12. The method according to claim 7, wherein, in the semiconductor pillar-forming step, the semiconductor pillars are formed so that a section of each of the semiconductor pillars in plan view has an elliptical shape, in plan view, a minor axis of the elliptical shape extends in a direction in which the semiconductor pillars are arranged in the one row, and a major axis of the elliptical shape extends in a direction perpendicular to the direction in which the semiconductor pillars are arranged in the one row.

* * * * *

UNITED STATES PATENT AND TRADEMARK OFFICE
CERTIFICATE OF CORRECTION

| | | |
|---|---|---|
| PATENT NO. | : 9,653,170 B2 | |
| APPLICATION NO. | : 15/228687 | |
| DATED | : May 16, 2017 | |
| INVENTOR(S) | : Fujio Masuoka et al. | |

It is certified that error appears in the above-identified patent and that said Letters Patent is hereby corrected as shown below:

In the Claims

In Column 20, Claim 1, Line 50, before "stacked material layer" insert --first--.

Signed and Sealed this
Ninth Day of October, 2018

Andrei Iancu
*Director of the United States Patent and Trademark Office*